(12) United States Patent
Kimura

(10) Patent No.: US 7,459,963 B2
(45) Date of Patent: Dec. 2, 2008

(54) FILTER APPARATUS INCLUDING DIFFERENTIAL SLAVE GM-C FILTER WITH FREQUENCY CHARACTERISTICS AUTOMATICALLY TUNED BY MASTER CIRCUIT

(75) Inventor: Katsuji Kimura, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 11/035,101

(22) Filed: Jan. 14, 2005

(65) Prior Publication Data

US 2005/0156661 A1 Jul. 21, 2005

(30) Foreign Application Priority Data

Jan. 19, 2004 (JP) ............................. 2004-010206

(51) Int. Cl.
*H03K 5/00* (2006.01)
(52) U.S. Cl. ........................................ 327/553; 327/552
(58) Field of Classification Search .......... 327/551–559
See application file for complete search history.

(56) References Cited

U.S. PATENT DOCUMENTS

| 5,117,205 A | * | 5/1992 | Nauta ..................... 331/117 FE |
| 5,731,737 A | * | 3/1998 | Cranford et al. ............ 327/553 |
| 6,791,401 B2 | * | 9/2004 | Miwa ......................... 327/556 |

FOREIGN PATENT DOCUMENTS

| JP | 4-165805 | 6/1992 |
| JP | 06140872 | * 5/1994 |
| JP | 10-13188 | 1/1998 |

OTHER PUBLICATIONS

Francois Krummenacher, et al., "A 4-MHz CMOS Continuous-Time Filter with On-Chip Automatic Tuning", IEEE Journal of Solid-State Circuits, vol. 23, No. 3, Jun. 1988, pp. 750-758.
Katsuji Kimura, "An MOS Operational Transconductance Amplifier and an MOS Four-Quadrant Analog Multiplier Using the Quadritail Cell", IEICE Trans. Fundamentals, vol. E75-A, No. 12, Dec. 1992, pp. 1774-1776.

* cited by examiner

*Primary Examiner*—Dinh T. Le
(74) *Attorney, Agent, or Firm*—McGinn IP Law Group PLLC

(57) ABSTRACT

In a filter apparatus including a master circuit for receiving a reference frequency signal having a reference frequency to generate a control voltage and a slave gm-C filter formed by at least one operational transconductance amplifier and at least one capacitor where the operational transconductance amplifier of the slave gm-C filter is controlled by the control voltage to tune a cut-off frequency or center frequency of the slave gm-C filter, the master circuit is constructed by first and second gm-C filters each formed by at least one operational transconductance amplifier and at least one capacitor and having different frequency characteristics from each other, the first and second gm-C filters being adapted to receive the reference frequency signal, first and second amplitude detectors having inputs connected to outputs of the first and second gm-C filters, respectively, and a differential amplifier having an input connected to outputs of the first and second amplitude detectors and being adapted to amplify a difference-voltage therebetween to generate the control voltage, so that the difference-voltage is brought close to zero.

20 Claims, 15 Drawing Sheets

FILTER APPARATUS INCLUDING DIFFERENTIAL SLAVE GM-C FILTER WITH FREQUENCY CHARACTERISTICS AUTOMATICALLY TUNED BY MASTER CIRCUIT

BACKGROUND OF THE INVENTION

1. Field of the Invention

The present invention relates to a filter apparatus including a slave gm-C filter formed by operational transconductance amplifiers (OTAs: gm) and capacitors (C) and a master circuit for automatically tuning the frequency characteristics such as a cut-off frequency or a center frequency of the slave gm-C filter.

2. Description of the Related Art

Wide-dynamic-range gm-C filters formed by metal oxide semiconductor (MOS) OTAs and capacitors have been developed since 1984. For these filters, an automatic tuning is required to maintain precise frequency characteristics of the gm-C filters in spite of manufacturing process variations, temperature drift and the like.

A first prior art gm-C filter apparatus formed on a large scale integrated circuit (LSI) chip is constructed by a slave gm-C filter and a master circuit formed by a phase-locked loop circuit for generating a control voltage for automatically tuning the frequency characteristics of the slave gm-C filter in accordance with a reference frequency signal (see: F. Krummenacher et al., "A 4-MHz CMOS Continuous-Time Filter with On-Chip Automatic Tuning", IEEE J. Solid-State Circuits, Vol. 23, No. 3, pp. 750-758, June 1988). This will be explained later in detail.

In the above-described first prior art gm-C filter apparatus, however, since the operation mechanism of the voltage-controlled oscillator (VCO) of the master circuit is much complex, this filter apparatus including the VCO is also complex.

Additionally, in the above-described first prior art gm-C filter apparatus, parasitic capacitances with realized circuits cannot be ignored, so that it is impossible to maintain a precise relationship between the oscillation frequency of the VCO and the cut-off frequency or center frequency of the slave gm-C filter, particularly, in a low current type filter apparatus where the drive currents of the OTAs are small.

A second prior art gm-C filter apparatus formed on an LSI chip is constructed by a slave filter circuit formed by two different gm-C filters and a master filter circuit formed by two different gm-C filters having the same structures as the gm-C filters of the slave filter circuit (see: JP-10-013188-A). The master filter circuit receives a reference frequency signal and generates control voltages for controlling the OTAs in the gm-C filters of the master filter circuit, so that the amplitudes of the output signals of the gm-C filters of the master filter circuit are made equal to each other. The control voltages are also used for controlling the gm-C filters of the slave filter circuit, thus automatically tuning the frequency characteristics thereof. This also will be explained later in detail.

In the above-described second prior art gm-C filter apparatus, however, since the gm-C filters of the master filter circuit have a similar structure to those of the slave filter circuit, when the slave filter circuit is constituted as a higher-order filter, the master filter circuit is large in circuit-scale, which would increase the manufacturing cost and the power consumption.

SUMMARY OF THE INVENTION

It is an object of the present invention to provide a simple filter apparatus including a slave gm-C filter and a master circuit for automatically tuning the frequency characteristics of the slave gm-C filter, capable of decreasing the parasitic capacitances with a realized circuit.

According to the present invention, in a filter apparatus including a master circuit for receiving a reference frequency signal having a reference frequency to generate a control voltage and a slave gm-C filter formed by at least one OTA and at least one capacitor where the OTA of the slave gm-C filter is controlled by the control voltage for tuning a cut-off frequency or center frequency of the slave gm-C filter, the master circuit is constructed by first and second gm-C filters each formed by at least one OTA and at least one capacitor and having different frequency characteristics from each other, the first and second gm-C filters being adapted to receive the reference frequency signal, first and second amplitude detectors having inputs connected to outputs of the first and second gm-C filters, respectively, and a differential amplifier having a differential input connected to outputs of the first and second amplitude detectors and being adapted to amplify a difference-voltage therebetween to generate the control voltage, so that the difference-voltage is brought close to zero.

BRIEF DESCRIPTION OF THE DRAWINGS

The present invention will be more clearly understood from the description set forth below, as compared with the prior art, with reference to the accompanying drawings, wherein.

Figure 3:
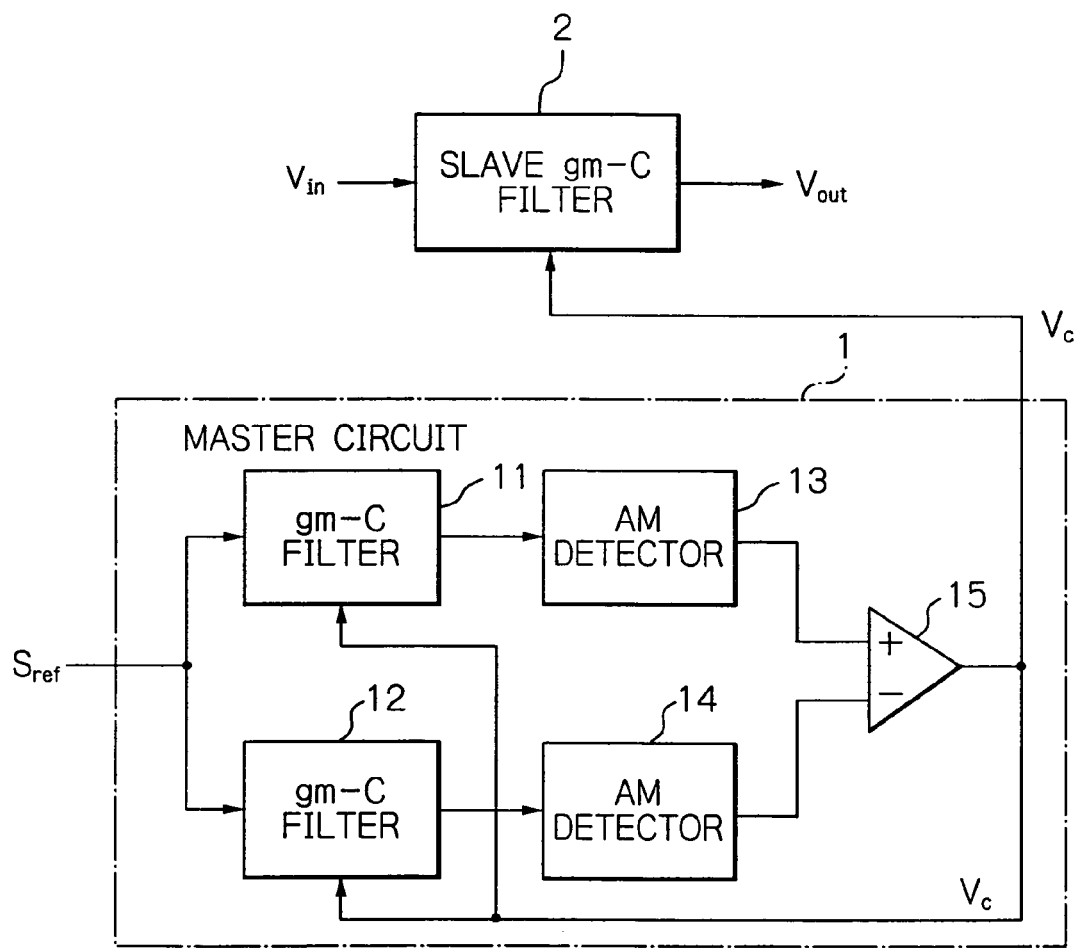
FIG. 3 is a circuit diagram illustrating an embodiment of the filter apparatus according to the present invention.
Figure 8:
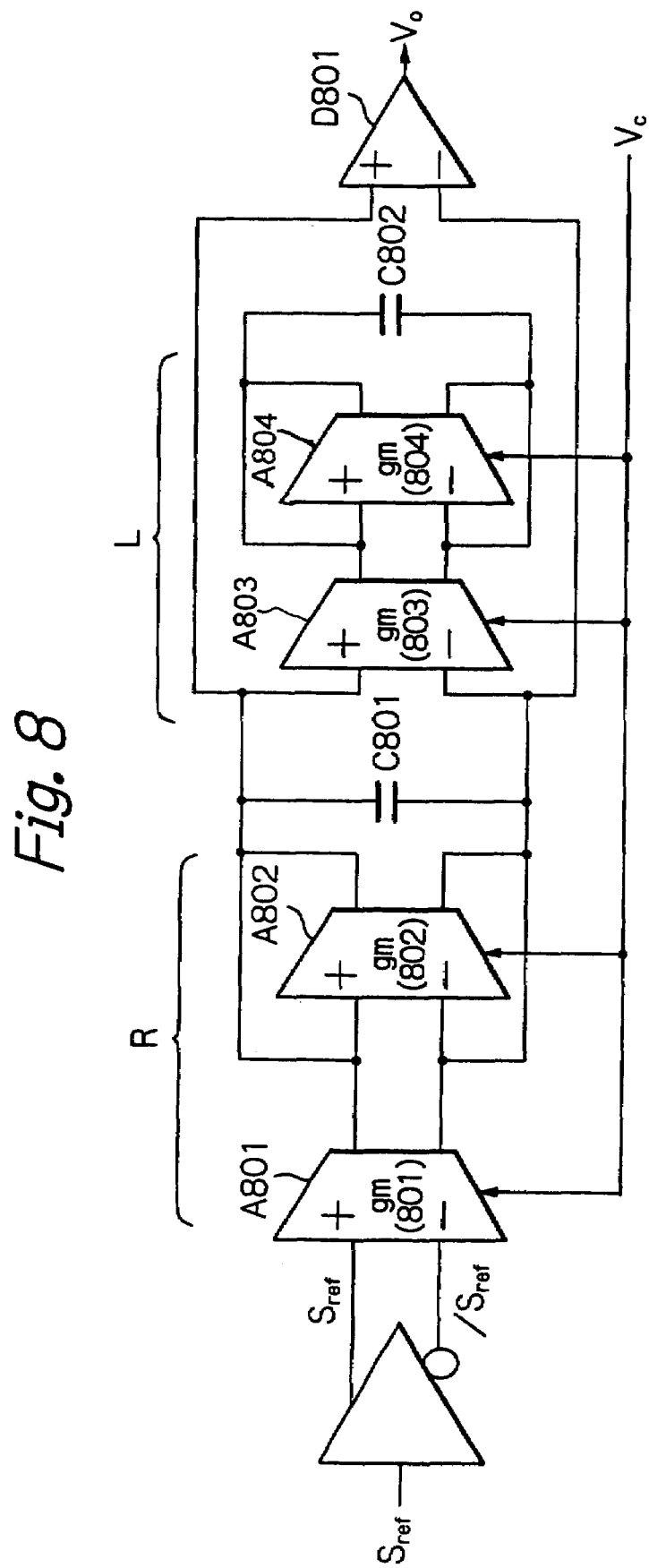
FIG. 8 is a circuit diagram of a second-order band pass filter (BPF) used as the gm-C filter of FIG. 3.
Figure 14A:
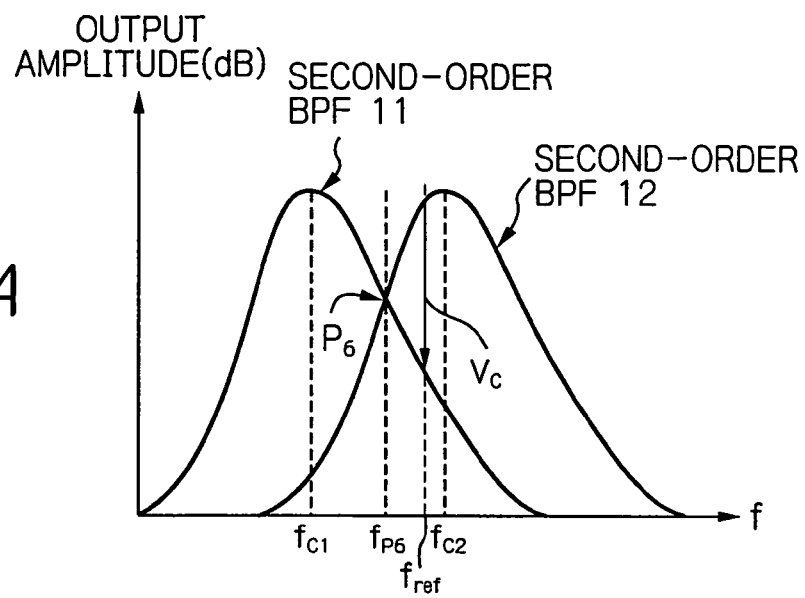
Figure 14B:
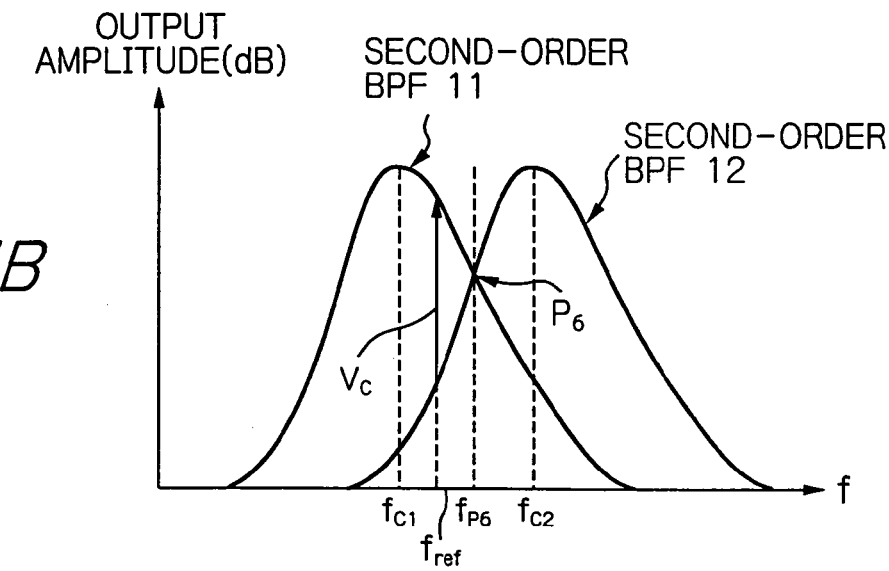
Figure 14C:
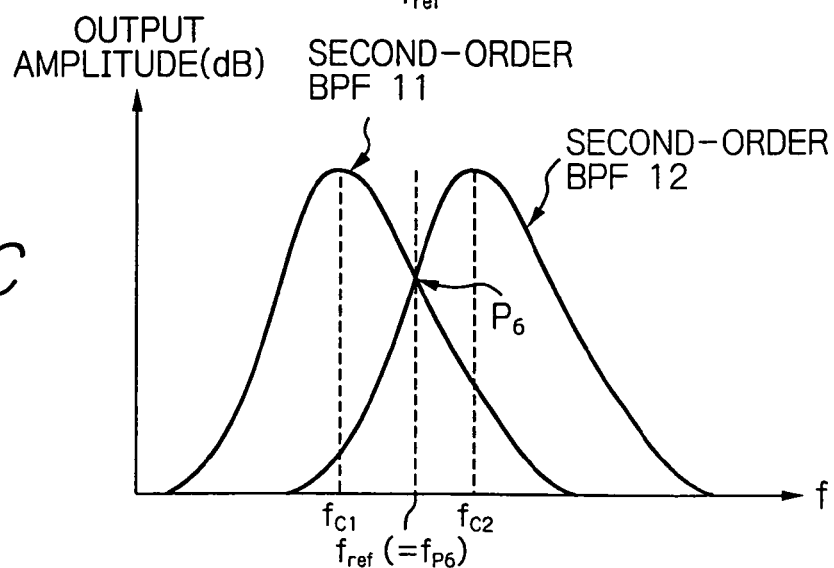
Figure 15:
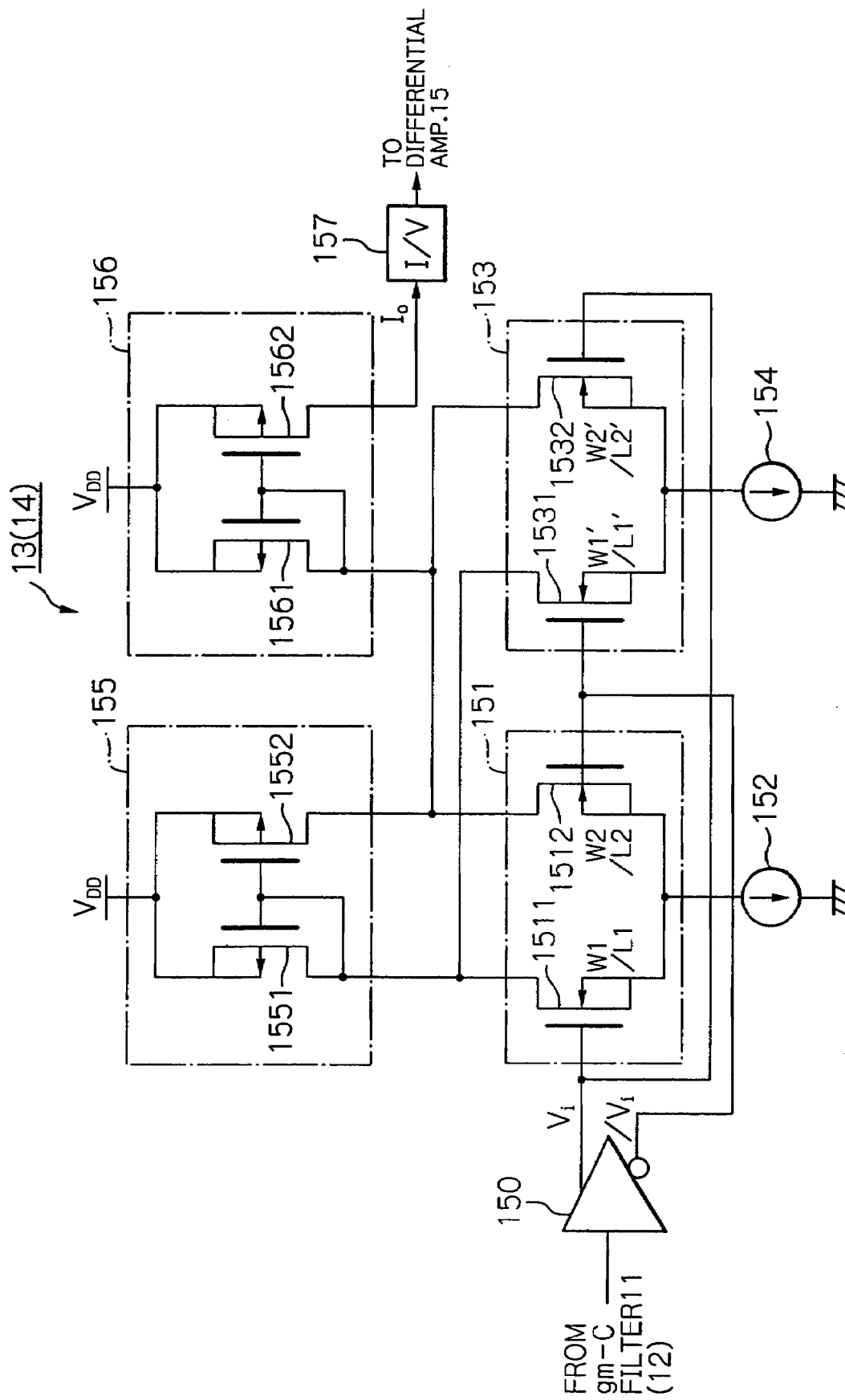
Figure 16:
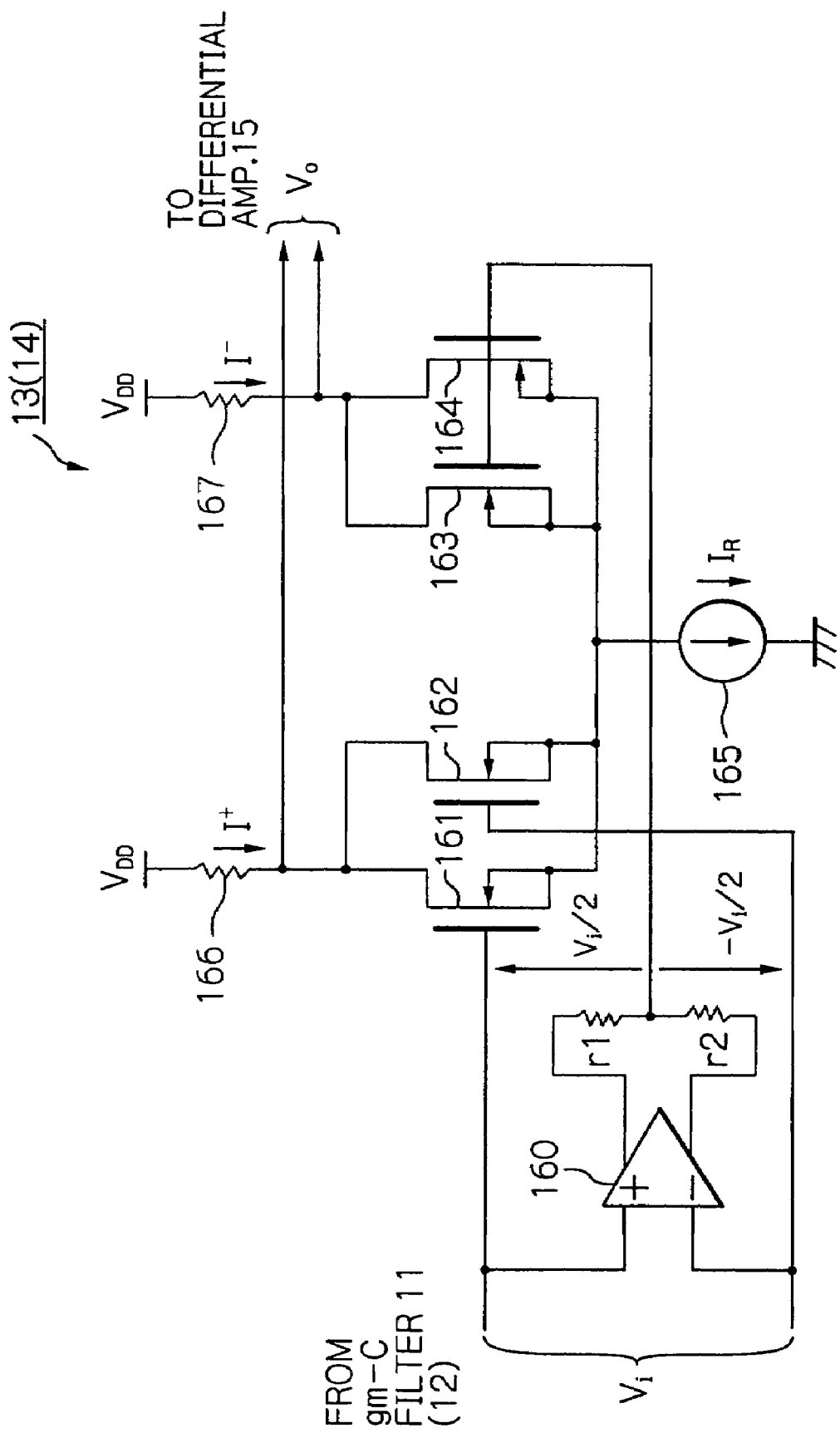

FIGS. 14A, 14B and 14C are graphs for explaining the operation of a sixth example of the filter apparatus of FIG. 3 where the second-order BPFs of FIG. 8 are used as the gm-C filters of FIG. 3; and FIGS. 15 and 16 are detailed circuit diagrams of the amplitude detector of FIG. 3.

DESCRIPTION OF THE PREFERRED EMBODIMENT

Before the description of the preferred embodiment, the prior art filter apparatuses will be explained by referencing to FIGS. 1 and 2.

Figure 1:
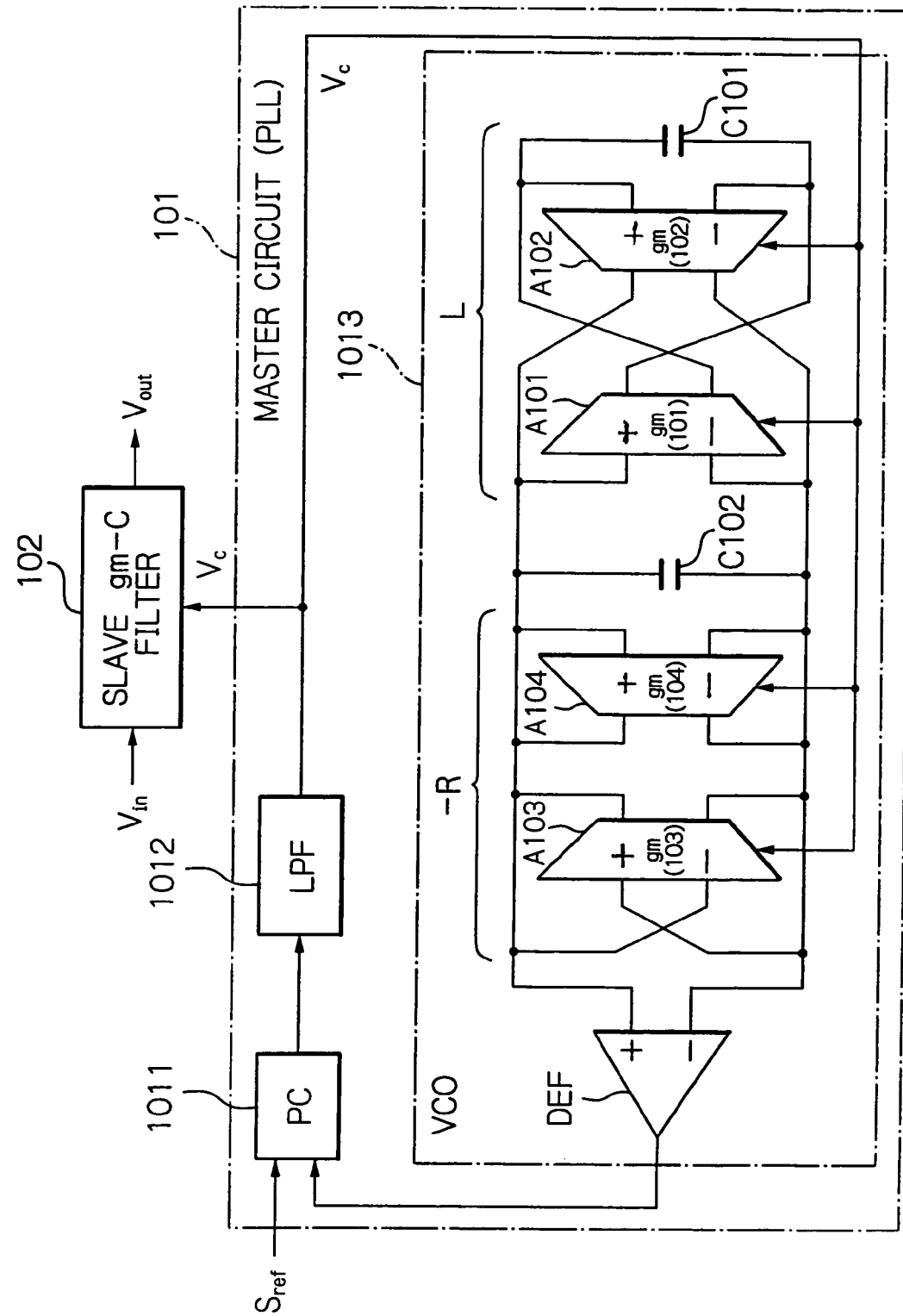
FIG. 1 is a circuit diagram illustrating a first prior art filter apparatus.

In FIG. 1, which illustrates a first prior art filter apparatus formed on an LSI chip (see: F. Krummenacher et al. "A 4-MHz CMOS Continuous-Time Filter with On-Chip Automatic Tuning", IEEE J. Solid-State Circuits, Vol. 23, No. 3, pp.750-758, Jun. 1988), reference numeral 101 designates a master circuit for receiving a reference frequency signal $S_{ref}$ having a reference frequency $f_{ref}$ to generate a control voltage $V_c$, and reference numeral 102 designates a slave gm-C filter for receiving an input voltage $V_{in}$ to generate an output voltage $V_{out}$. In this case, the transconductance values of the OTAs in the slave gm-C filter 102 are controlled by the control voltage $V_c$ to adjust the cut-off frequency or center frequency of the slave gm-C filter 102.

The master circuit 101 is a phase-locked loop (PLL) circuit which is constructed by a phase comparator 1011, a loop filter (LPF) 1012 and a voltage control oscillator (VCO) 1013. That is, the phase comparator 1011 detects a difference in phase between the reference frequency signal $S_{ref}$ and the output signal from the VCO 1013, so that this difference in phase is fed back via the LPF 1012 as the control voltage $V_C$ to the VCO 1013. Thus, the phase of the output signal of the VCO 1013 is brought close to that of the reference frequency signal $S_{ref}$.

The VCO 1013 is constructed by a capacitor C101, OTAs A101 and A102 having transconductance values gm(101) and gm(102), respectively, a capacitor C102, OTAs A103 and A104 having transconductance values gm(103) and gm(104), respectively, and a differential amplifier DEF. In this case, the OTAs A101 and A102 and the capacitor C101 form an equivalent inductance L in accordance with the Gyrator theory. Also, the equivalent inductance L and the capacitor C102 form an LC parallel resonator. Further, the transconductance values gm(103) and gm(104) of the OTAs A103 and A104 are determined to be gm(103)>gm(104), so that the OTAs A103 and A104 form a negative resistance (−R=−1/gm). Additionally, the input voltage range of the OTA A103 is narrower than that of the OTA A104 in order to limit the amplitude of the voltage controlled oscillator 1013.

In FIG. 1, since the drive currents of the OTAs A101, A102, A103 and A104 controlled by the control voltage $V_C$ are brought close to those of the OTAs in the slave gm-C filter 102 controlled by the control voltage $V_c$, the transconductance values gm(101), gm(102), gm(103) and gm(104) of the OTAs A101, A102, A103 and A104 are brought close to those of the OTAs of the slave gm-C filter 102. In this case, the capacitance values of the capacitors C101 and C102 of the VCO 1013 usually have a precise relationship with those of the capacitors of the slave gm-C filter 102. Thus, even when the characteristics of the entire filter apparatus of FIG. 1 change due to manufacturing process variations, temperature drift, and the like, the oscillation frequency of the VCO 1013 can have a precise relationship with the frequency characteristics such as a cut-off frequency or center frequency of the slave gm-C filter 102, so that the frequency characteristics of the slave gm-C filter 102 are automatically tuned in accordance with the reference frequency $f_{ref}$ of the reference frequency signal $S_{ref}$.

In FIG. 1, note that a current controlled oscillator can be provided instead of the VCO 1013.

In the filter apparatus of FIG. 1, however, since the VCO 1013 is complex, the filter apparatus of FIG. 1 is also complex.

Additionally, in the filter apparatus of FIG. 1, the oscillation frequency of the VCO 1013 has to be within a stop band of the slave gm-C filter 102 in order to suppress the effect of the oscillation frequency of the VCO 1013 on the slave gm-C filter 102. However, if the oscillation frequency of the VCO 1013 is too far from the cut-off frequency or center frequency of the slave gm-C filter 102, the capacitance values of the capacitors C101 and C102 of the VCO 1013 will be smaller than those of the slave gm-C filter 102. As a result, parasitic capacitances with realized circuits, which capacitances are not relatively smaller than the capacitance values of the capacitors C101 and C102, cannot be ignored, so that it is impossible to maintain the above-mentioned precise relationship between the oscillation frequency of the VCO 1013 and the cut-off frequency or center frequency of the slave gm-C filter 102, particularly, in a low current type filter apparatus where the drive currents of the OTAs are small.

Figure 2:
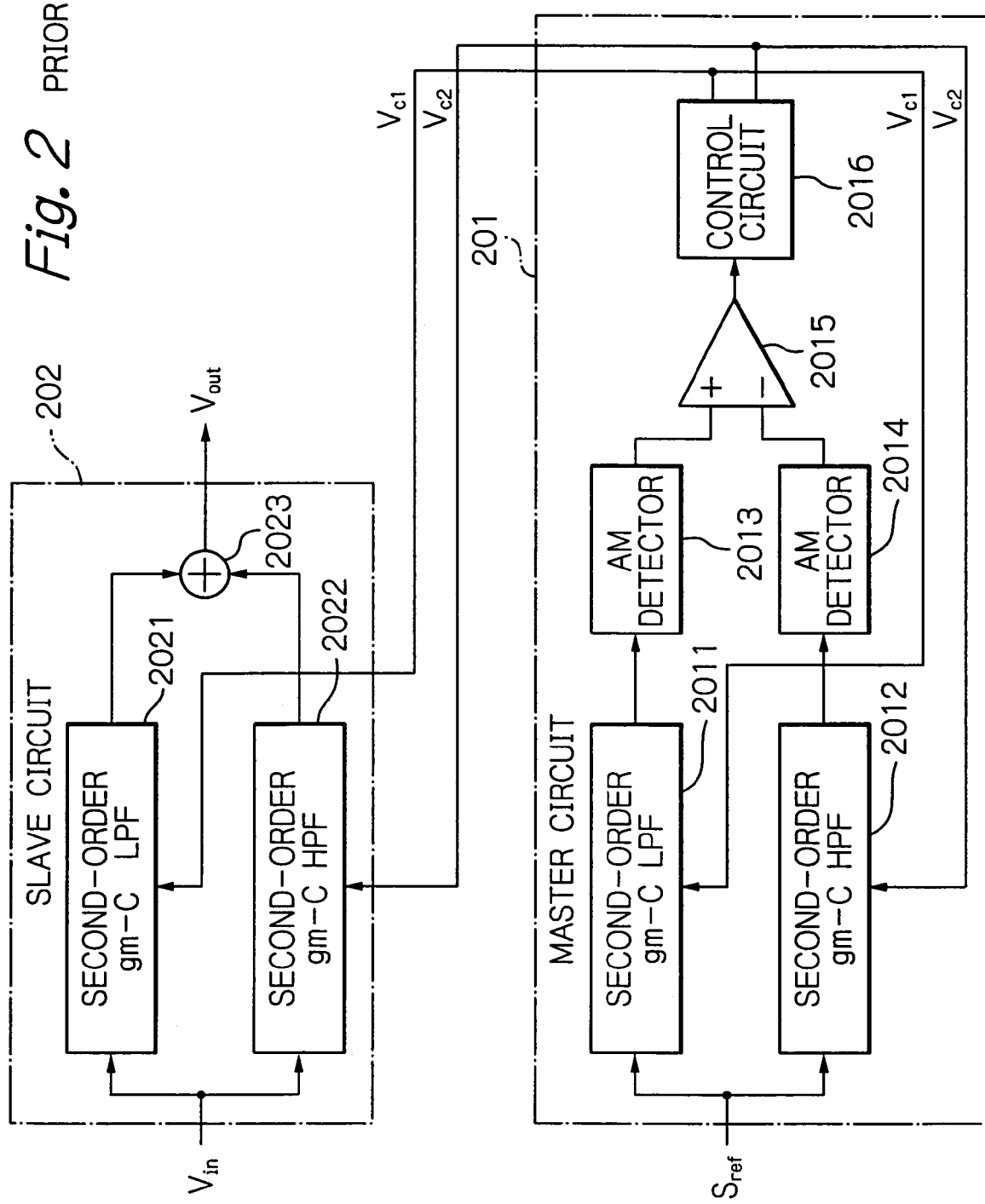
FIG. 2 is a circuit diagram illustrating a second prior art filter apparatus.

In FIG. 2, which illustrates a second prior art filter apparatus formed on an LSI chip (see: JP-10-013188-A), reference numeral 201 designates a master circuit for receiving a reference frequency signal $S_{ref}$ having a reference frequency $f_{ref}$ to generate control voltages $VC_{C1}$ and $V_{C2}$, and reference numeral 202 designates a slave circuit for receiving an input voltage $V_{in}$ to generate an output voltage $V_{out}$. The slave circuit 202 is formed by two gm-C filters controlled by the control voltages $V_{C1}$ and $V_{C2}$, respectively, to adjust the center frequency of the frequency characteristics of the slave circuit 202.

The master circuit 201 is constructed by a second-order gm-C LPF 2011 for receiving the reference signal $S_{ref}$, a second-order gm-C HPF 2012 for receiving the reference frequency signal $S_{ref}$, an amplitude detector 2013 for detecting an amplitude of the output signal of the second-order gm-C LPF 2011, an amplitude detector 2014 for detecting an amplitude of the output signal of the second-order gm-C HPF 2012, a differential amplifier 2015 for amplifying the difference-voltage between the output signals of the amplitude detectors 2013 and 2014, and a control circuit 2016 for generating the control voltages $V_{C1}$ and $V_{C2}$, so that the difference-voltage between the amplitude detectors 2013 and 2014 is brought close to zero.

On the other hand, the slave circuit 202 is constructed by a second-order gm-C LPF 2021 for receiving the input voltage $V_{in}$, a second-order gm-C HPF 2022 for receiving the input voltage $V_{in}$, and an adder 2023 for adding the output signal of the second-order gm-C LPF 2021 to that of the second-order gm-C HPF 2022 to generate the output voltage $V_{out}$.

The second-order gm-C LPF 2021 has the same frequency characteristics as the second-order gm-C LPF 2011, and the second-order gm-C HPF 2022 has the same frequency characteristics as the second-order gm-C HPF 2012.

In FIG. 2, the second-order gm-C LPF 2011 and the second-order gm-C HPF 2012 form a fourth-order gm-C BPF, and the second-order gm-C LPF 2021 and the second-order gm-C HPF 2022 form a fourth-order gm-C BPF. Also, the second-order gm-C LPF 2011 and the second-order gm-C HPF 2012 are controlled by the control voltages $V_{C1}$ and $V_{C2}$, respectively, and simultaneously, the second-order gm-C LPF 2021 and the second-order gm-C HPF 2022 are controlled by the control voltages $V_{C1}$ and $V_{C2}$, respectively.

Thus, even when the characteristics of the entire filter apparatus of FIG. 2 change due to manufacturing process variations, temperature drift and the like, the frequency characteristics of the slave circuit 202 can be automatically tuned in accordance with the reference frequency $f_{ref}$ of the reference frequency signal $S_{ref}$.

In the filter apparatus of FIG. 2, however, since the master circuit 201 has a similar structure to that of the slave circuit 202, when the slave circuit 202 is constituted as a higher-order HPF, i.e., a k-th-order BPF ($k \geq 6$), the master circuit 201 is large in circuit scale, which would increase the manufacturing cost and the power consumption.

In FIG. 3, which illustrates an embodiment of the filter apparatus according to the present invention formed on an LSI chip, reference numeral 1 designates a master circuit for receiving a sinusoidal reference frequency signal $S_{ref}$ having a reference frequency $f_{ref}$ to generate a control voltage $V_C$, and reference numeral 2 designates a slave gm-C filter for receiving an input voltage $V_{in}$, to generate an output $V_{out}$. The slave gm-C filter 2 is controlled by the control voltage $V_C$ to adjust the cut-off frequency or center frequency of the slave gm-C filter 2.

The master circuit 1 is constructed by two lower-order gm-C filters 11 and 12 having different frequency characteristics from each other and receiving the reference frequency signal $S_{ref}$, amplitude detectors 13 and 14 for detecting amplitudes of the output signals of the gm-C filters 11 and 12, respectively, and a differential amplifier 15 for amplifying the difference-voltage between the output signals of the amplitude detectors 13 and 14 to generate the control voltage $V_c$, so that this difference-voltage is brought close to zero.

In FIG. 3, the gm-C filters 11 and 12 are controlled by the control voltage $V_C$, and simultaneously, the gm-C filter 2 is controlled by the control voltage $V_C$.

Figure 4:
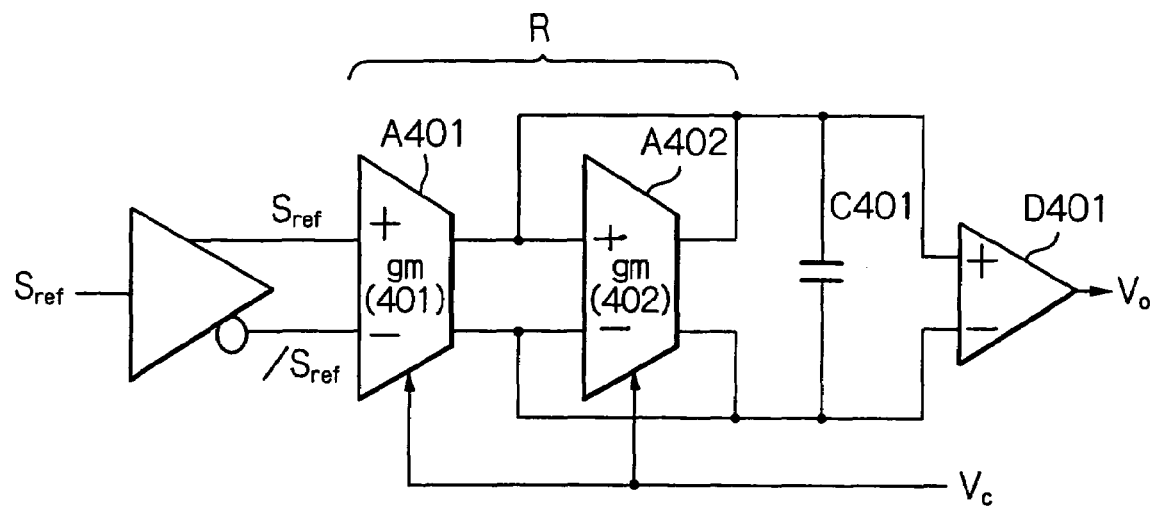
FIG. 4 is a circuit diagram of a first-order low pass filter (LPF) used as the gm-C filter of FIG. 3.
Figure 5:
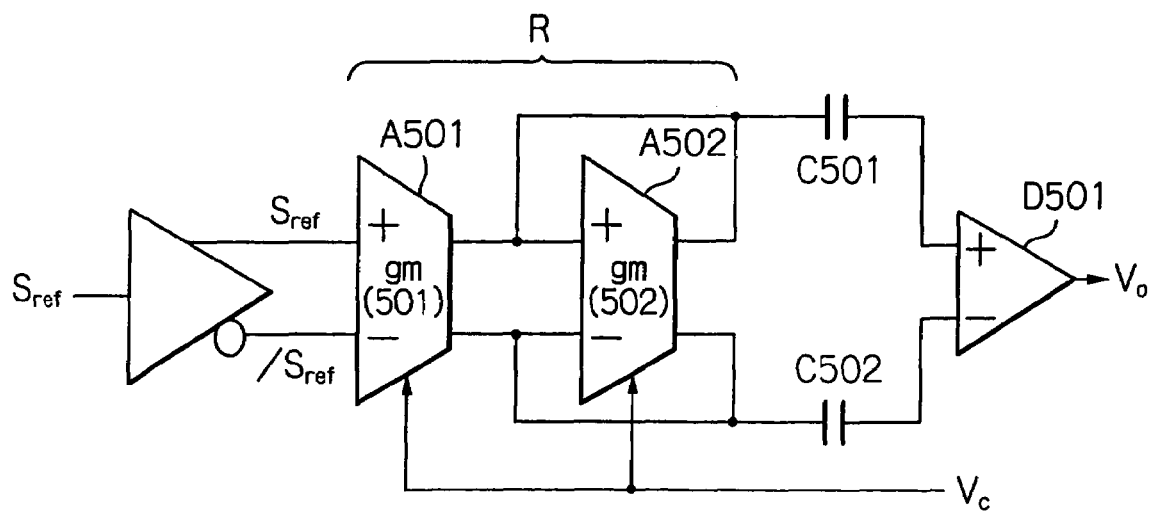
FIG. 5 is a circuit diagram of a first-order high pass filter (HPF) used as the gm-C filter of FIG. 3.
Figure 6:
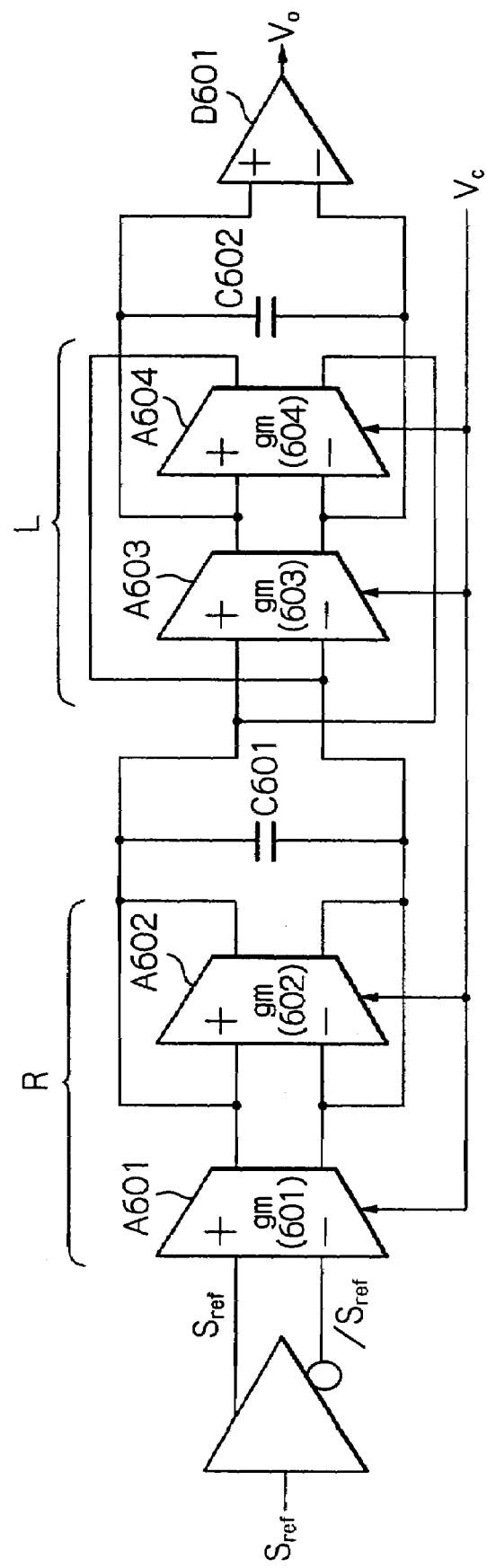
FIG. 6 is a circuit diagram of a second-order LPF used as the gm-C filter of FIG. 3.
Figure 7:
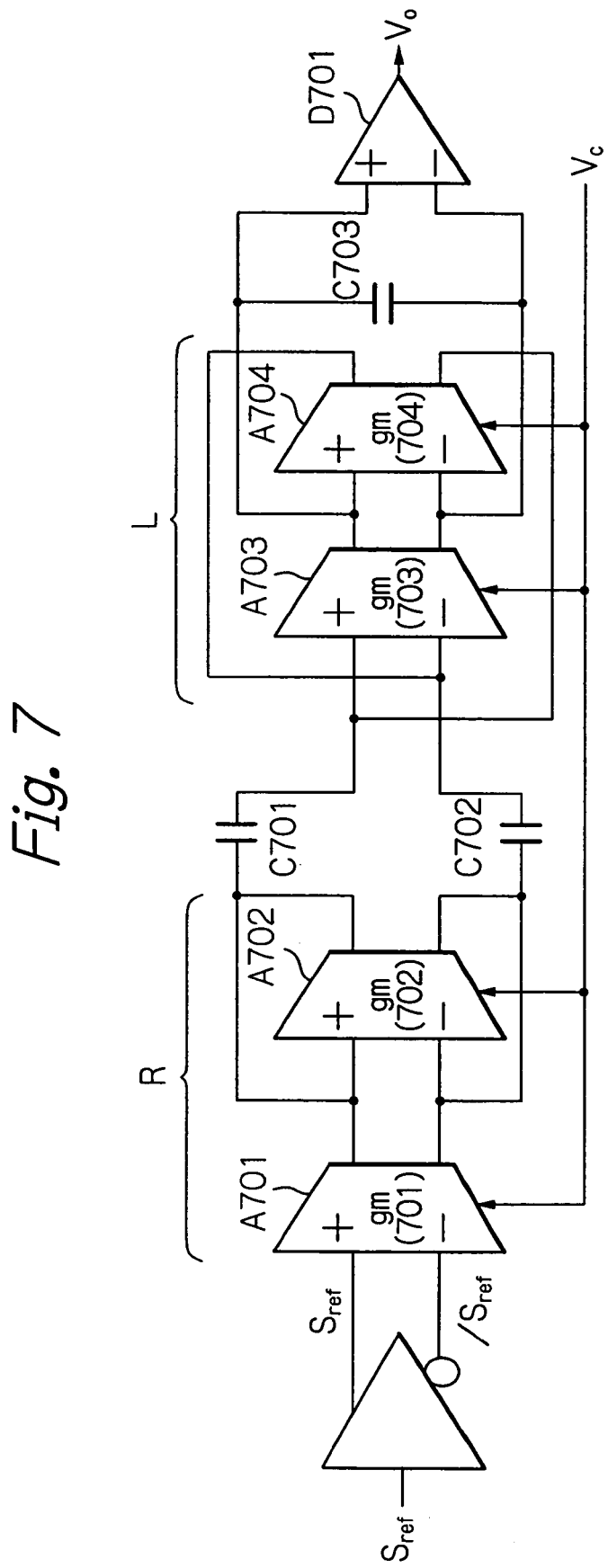
FIG. 7 is a circuit diagram of a second-order HPF used as the gm-C filter of FIG. 3.

Each of the gm-C filters 11 and 12 is constructed by a lower-order filter such as a first-order LPF as illustrated in FIG. 4, a first-order HPF as illustrated in FIG. 5, a second-order LPF as illustrated in FIG. 6, a second-order HPF as illustrated in FIG. 7, or a second-order BPF as illustrated in FIG. 8, which would decrease the manufacturing cost and the power consumption. On the other hand, the slave gm-C filter 2 can be formed by a higher-order filter as well as the above-mentioned lower-order filter.

The first-order LPF of FIG. 4 is constructed by two OTAs A401 and A402 with transconductance values gm(401) and gm(402), respectively, forming an equivalent resistance R and a capacitor C401, which is called an integrator for receiving the reference frequency signal $S_{ref}$ to generate an output voltage $V_0$ through a differential amplifier D401. The transfer function H(s) of the first-order LPF of FIG. 4 is represented by $$H(s)=1/(1+sRC) \qquad (1)$$

where C is a capacitance of the capacitor C401. The drive currents of the OTAs A401 and A402 are controlled by the control voltage $V_C$.

The first-order HPF of FIG. 5 is constructed by two OTAs A501 and A502 with transconductance values gm(501) and gm(502), respectively, forming an equivalent resistance R and capacitors C501 and C502, which is called a differentiator for receiving the reference frequency signal $S_{ref}$ to generate an output voltage $V_0$ through a differential amplifier D501. The transfer function H(s) of the first-order HPF of FIG. 5 is represented by:

$$H(s)=sCR/(1+sRC) \qquad (2)$$

where C is a capacitance of each of the capacitors C501 and C502. The drive currents of the OTAs A501 and A502 are controlled by the control voltage $V_C$.

The second-order LPF of FIG. 6 is constructed by two OTAs A601 and A602 with transconductance values gm(601) and gm(602), respectively, forming an equivalent resistance R, a capacitor C601, two OTAs A603 and A604 with transconductance values gm(603) and gm(604), respectively, forming an equivalent inductance L and a capacitor C602, for receiving the reference frequency signal $S_{ref}$ to generate an output voltage $V_0$ through a differential amplifier D601. The transfer function H(s) of the second-order LPF of FIG. 6 is represented by $$H(s)=\omega_0^2/(s^2+\omega_0 s/Q+\omega_0^2) \qquad (3)$$

where $\omega_0$ is an angular frequency of a pole; and

Q is a Q value of the pole. The drive currents of the OTAs A601, A602, A603 and A604 are controlled by the control voltage $V_C$.

The second-order HPF of FIG. 7 is constructed by two OTAs A701 and A702 with transconductance values gm(701) and gm(702), respectively, forming an equivalent resistance R, two capacitors C701 and C702, two OTAs A703 and A704 with transconductance values gm(703) and gm(704), respectively, forming an equivalent inductance L and a capacitor C703, for receiving the reference frequency signal $S_{ref}$ to generate an output voltage $V_0$ through a differential amplifier D701. The transfer function H(s) of the second-order HPF of FIG. 7 is represented by $$H(s)=s^2/(s^2+\omega_0 s/Q+\omega_0^2) \qquad (4)$$

where $\omega_0$ is an angular frequency of a pole; and

Q is a Q value of the pole. The drive currents of the OTAs A701, A702, A703 and A704 are controlled by the control voltage $V_C$.

The second-order BPF of FIG. 8 is constructed by two OTAs A801 and A802 with transconductance values gm(801) and gm(802), respectively, forming an equivalent resistance R, a capacitor C801, two OTAs A803 and A804 with transconductance values gm(803) and gm(804), respectively, forming an equivalent inductance L and a capacitor C802, for receiving the reference frequency signal $S_{ref}$ to generate an output voltage $V_0$ through a differential amplifier D801. The transfer function H(s) of the second-order BPF of FIG. 6 is represented by $$H(s)=(\omega_0 s/Q)/(s^2+\omega_0 s/Q+\omega_0^2) \qquad (5)$$

where $\omega_0$ is an angular frequency of a pole; and

Q is a Q value of the pole. The drive currents of the OTAs A801, A802, A803 and A804 are controlled by the control voltage $V_C$.

Note that the larger a drive current flowing through an OTA, the smaller the transconductance value gm thereof. For example, if the OTA is formed by MOS transistors, the transconductance value gm thereof is proportional to the square root value of the drive current. Also, if the OTA is formed by bipolar transistors, the transconductance value gm thereof is proportional to the value of the drive current.

The operation of a first example of the filter apparatus of FIG. 3 will be explained next with reference to FIGS. 9A, 9B and 9C where the second-order LPF of FIG. 6 is used as the gm-C filter 11 of FIG. 3 and the first-order LPF of FIG. 4 is used as the gm-C filter 12 of FIG. 3.

The frequency characteristics of the second-order LPF 11 can be determined by the transconductance values and the capacitance value of the circuit of FIG. 6 to have an output amplitude of 40 dB/decade. On the other hand, the frequency characteristics of the first-order LPF 12 can be determined by the transconductance values and the capacitance values of the circuit of FIG. 4 to have an output amplitude of 20 dB/decade. Therefore, since there is a difference of 20 dB/decade in output amplitude between the second-order LPF 11 and the first-order LPF 12, the output amplitude of the second-order LPF 11 crosses that of the first-order LPF 12 at a point $P_1$ where a frequency f is $f_{P1}$, as shown in FIGS. 9A, 9B and 9C. In this case, if $f>f_{P1}$, the output amplitude of the first-order LPF 12 is higher than that of the second-order LPF 11, so that the control voltage $V_C$ is decreased. On the other hand, if $f<f_{P1}$, the output amplitude of the second-order LPF 11 is higher than that of the first-order LPF 12, so that the control voltage $V_C$ is increased.

Figure 9A:
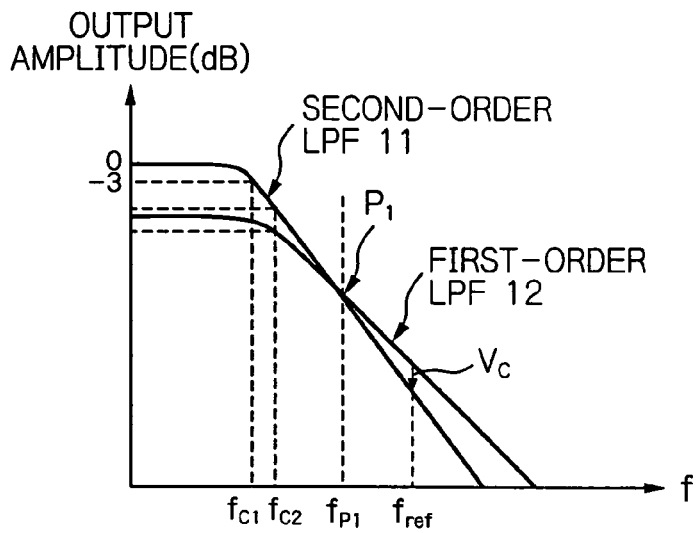
FIGS. 9A, 9B and 9C are graphs for explaining the operation of a first example of the filter apparatus of FIG. 3 where the first-order LPF of FIG. 4 and the second-order LPF of FIG. 6 are used as the gm-C filters of FIG. 3.
Figure 9B:
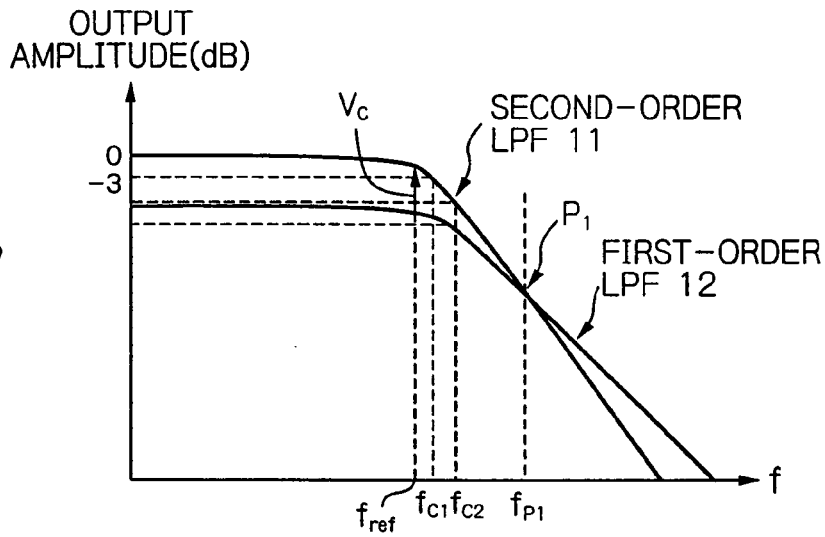
Figure 9C:
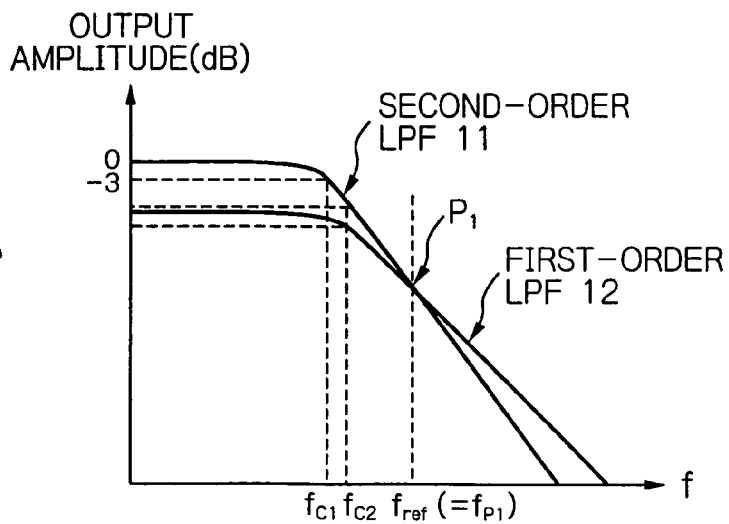

The drive currents of the OTAs of the second-order LPF 11 and the first-order LPF 12 are controlled by the control voltage $V_c$, so that the frequency $f_{P1}$ at the point $P_1$ is finally brought close to the reference frequency $f_{ref}$ as, shown in FIG. 9C. In other words, the output amplitude of the second-order LPF 11 finally crosses the output amplitude of the first-order LPF 12 at the reference frequency $f_{ref}$.

In more detail, as shown in FIG. 9A, if the output amplitude of the first-order LPF 12 is higher than that of the second-order LPF 11 at the reference frequency $f_{ref}$, the control voltage $V_C$ is decreased, so that the drive currents of the OTAs of the LPFs 11 and 12 are decreased to increase the frequency $f_{P1}$ at the point $P_1$ toward the reference frequency $f_{ref}$, thus increasing the cut-off frequencies $f_{C1}$ and $f_{C2}$ of the LPFs 11 and 12. On the other hand, as shown in FIG. 9B, if the output amplitude of the second-order LPF 11 is higher than that of the first-order LPF 12 at the reference frequency $f_{ref}$, the control voltage $V_C$ is increased, so that the drive currents of the OTAs of the LPFs 11 and 12 are increased to decrease the frequency $f_{P1}$ at the point $P_1$ toward the reference frequency $f_{ref}$, thus decreasing the cut-off frequencies $f_{C1}$ and $f_{C2}$ the LPFs 11 and 12.

In the above-mentioned first example, if the slave gm-C filter 2 is formed by a second-order LPF, the cut-off frequency of the slave gm-C filter 2 will be unambiguously set at $f_{c1}$ as shown in FIG. 9C, and if the slave gm-C filter 2 is formed by a first-order LPF, the cut-off frequency of the slave gm-C filter 2 will be unambiguously set at $f_{C2}$ as shown in FIG. 9C. However, the slave gm-C filter 2 can be formed by another type filter such as a first-order HPF, a second-order HPF, a second-order BPF, or a higher-order filter. Even in this case, since the change of the frequency characteristics of the other type filter by the control voltage $V_C$ would follow the change of the frequency characteristics of the filters 11 and 12 by the control voltage $V_C$, the cut-off frequency or center frequency of the slave gm-C filter 2 can be unambiguously set.

Also, in the above-mentioned first example, the second-order LPF and the first-order LPF are interchangeable in accordance with the signs of input terminals of the differential amplifier 15.

Further, in the above-mentioned first example, the reference frequency signal $S_{ref}$ can be rectangular, since the LPFs 11 and 12 can attenuate harmonic waves higher than third-order harmonic waves, so that the amplitude detectors 13 and 14 are not subject to such higher-order harmonic waves.

The operation of a second example of the filter apparatus of FIG. 3 will be explained next with reference to FIGS. 10A, 10B and 10C where the first-order HPF of FIG. 5 is used as the gm-C filter 11 of FIG. 3 and the second-order HPF of FIG. 7 is used as the gm-C filter 12 of FIG. 3.

The frequency characteristics of the first-order HPF 11 can be determined by the transconductance values and the capacitance value of the circuit of FIG. 5 to have an output amplitude of 40 dB/decade. On the other hand, the frequency characteristics of the second-order HPF 12 can be determined by the transconductance values and the capacitance values of the circuit of FIG. 7 to have an output amplitude of 20 dB/decade. Therefore, since there is a difference of 20 dB/decade in output amplitude between the first-order HPF 11 and the second-order HPF 12, the output amplitude of the first-order HPF 11 crosses that of the second-order HPF 12 at a point $P_2$ where a frequency f is $f_{P2}$ as shown in FIGS. 10A, 10B and 10C. In this case, if $f>f_{P2}$, the output amplitude of the second-order HPF 12 is higher than that of the first-order HPF 11, so that the control voltage $V_C$ is decreased. On the other hand, if $f<f_{P1}$, the output amplitude of the first-order HPF 11 is higher than that of the second-order HPF 12, so that the control voltage $V_C$ is increased.

Figure 10A:
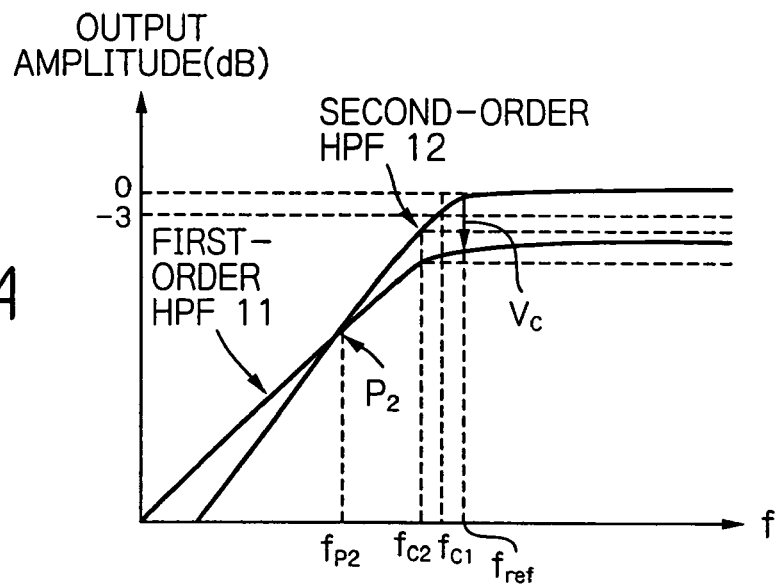
FIGS. 10A, 10B and 10C are graphs for explaining the operation of a second example of the filter apparatus of FIG. 3 where the first-order HPF of FIG. 6 and the second-order HPF of FIG. 7 are used as the gm-C filters of FIG. 3.
Figure 10B:
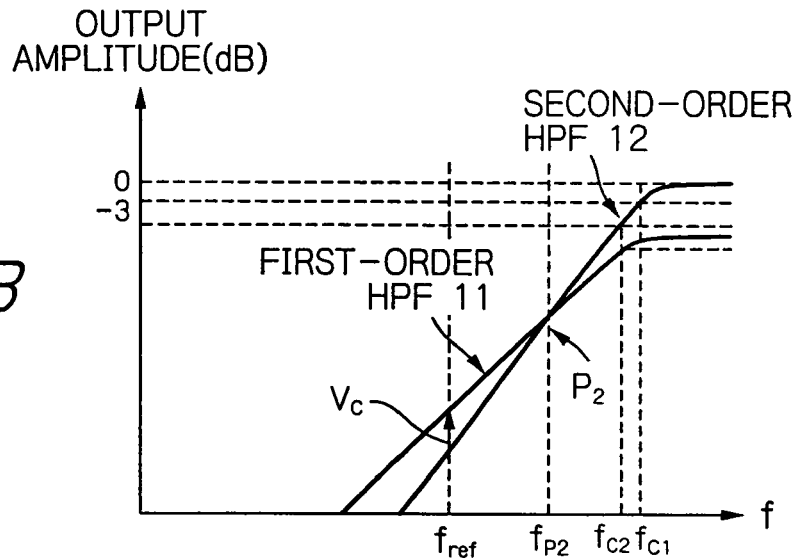
Figure 10C:
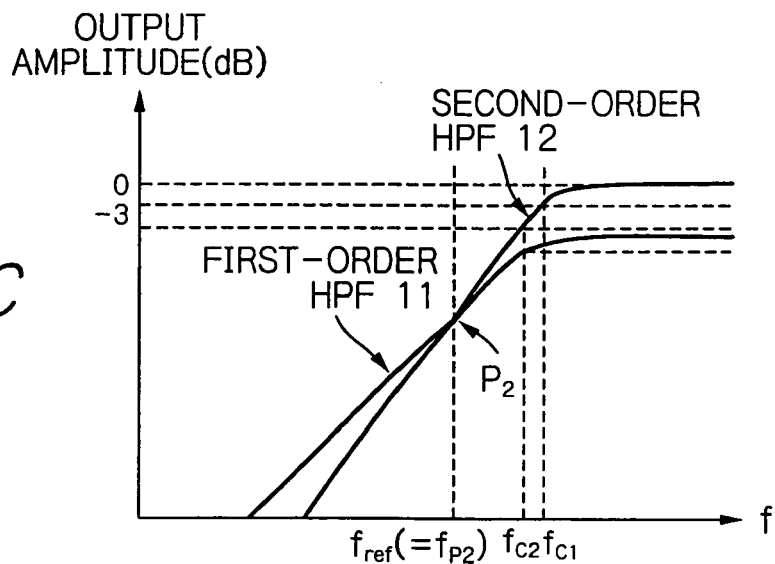

The drive currents of the OTAs of the first-order HPF 11 and the second-order HPF 12 are controlled by the control voltage $V_c$, so that the frequency $f_{P2}$ at the point $P_2$ is finally brought close to the reference frequency $f_{ref}$ as shown in FIG. 10C. In other words, the output amplitude of the first-order HPF 11 finally crosses the output amplitude of the second-order HPF 12 at the reference frequency $f_{ref}$.

In more detail, as shown in FIG. 10A, if the output amplitude of the second-order HPF 12 is higher than that of the first-order HPF 11 at the reference frequency $f_{ref}$, the control voltage $V_C$ is decreased, so that the drive currents of the OTAs of the HPFs 11 and 12 are decreased to increase the frequency $f_{P2}$ at the point $P_2$ toward the reference frequency $f_{ref}$, thus increasing the cut-off frequencies $f_{C1}$, and $f_{C2}$ of the HPFs 11 and 12. On the other hand, as shown in FIG. 10B, if the output amplitude of the first-order HPF 11 is higher than that of the first-order LPF 12 at the reference frequency $f_{ref}$, the control voltage $V_C$ is increased, so that the drive currents of the OTAs of the HPFs 11 and 12 are increased to decrease the frequency $f_{P2}$ at the point $P_2$ toward the reference frequency $f_{ref}$, thus decreasing the cut-off frequencies $f_{C1}$ and $f_{C2}$ the HPFs 11 and 12.

In the above-mentioned second example, if the slave gm-C filter 2 is formed by a first-order HPF, the cut-off frequency of the slave gm-C filter 2 will be unambiguously set at $f_{c1}$ as shown in FIG. 10C, and if the slave gm-C filter 2 is formed by a second-order HPF, the cut-off frequency of the slave gm-C filter 2 will be unambiguously set at $f_{c2}$ as shown in FIG. 10C. However, the slave gm-C filter 2 can be formed by another type filter such as a first-order LPF, a second-order LPF, a second-order BPF, or a higher-order filter. Even in this case, since the change of the frequency characteristics of the other type filter by the control voltage $V_c$ would follow the change of the frequency characteristics of the filters 11 and 12 by the control voltage $V_c$, the cut-off frequency or center frequency of the slave gm-C filter 2 can be unambiguously set.

Also, in the above-mentioned second example, the first-order HPF and the second-order HPF are interchangeable in accordance with the signs of input terminals of the differential amplifier 15.

Further, in the above-mentioned second example, the reference frequency signal $S_{ref}$ can be rectangular, since the amplitude detectors 13 and 14 can attenuate harmonic waves higher than third-order harmonic waves.

The operation of a third example of the filter apparatus of FIG. 3 will be explained next with reference to FIGS. 11A, 11B and 11C where the first-order LPF of FIG. 4 is used as the gm-C filter 11 of FIG. 3 and the first-order HPF of FIG. 5 is used as the gm-C filter 12 of FIG. 3.

The frequency characteristics of the first-order LPF 11 can be determined by the transconductance values and the capacitance value of the circuit of FIG. 4 to have an output amplitude of 20 dB/decade. On the other hand, the frequency characteristics of the first-order HPF 12 can be determined by the transconductance values and the capacitance values of the circuit of FIG. 5 to have an output amplitude of 20 dB/decade. However, since there is a difference of changing direction in output amplitude between the first-order LPF 11 and the first-order HPF 12, the output amplitude of the first-order LPF 11 crosses that of the first-order HPF 12 at a point $P_3$ where a frequency f is $f_{P3}$ as shown in FIGS. 11A, 11B and 11C. In this case, if $f>f_{P3}$, the output amplitude of the first-order HPF 12 is higher than that of the first-order LPF 11, so that the control voltage $V_C$ is decreased. On the other hand, if $f<f_{P3}$, the output amplitude of the first-order LPF 11 is higher than that of the first-order HPF 12, so that the control voltage $V_C$ is increased.

Figure 11A:
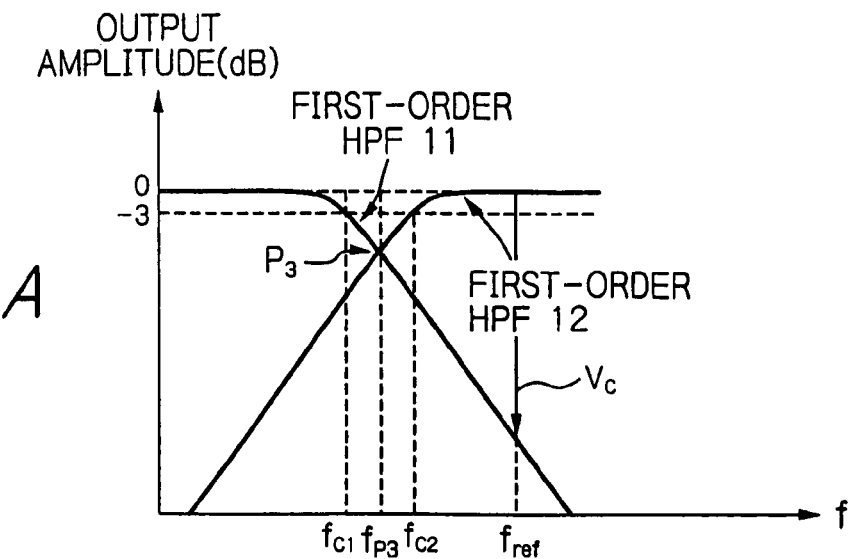
FIGS. 11A, 11B and 11C are graphs for explaining the operation of a third example of the filter apparatus of FIG. 3 where the first-order LPF of FIG. 4 and the first-order HPF of FIG. 6 are used as the gm-C filters of FIG. 3.
Figure 11B:
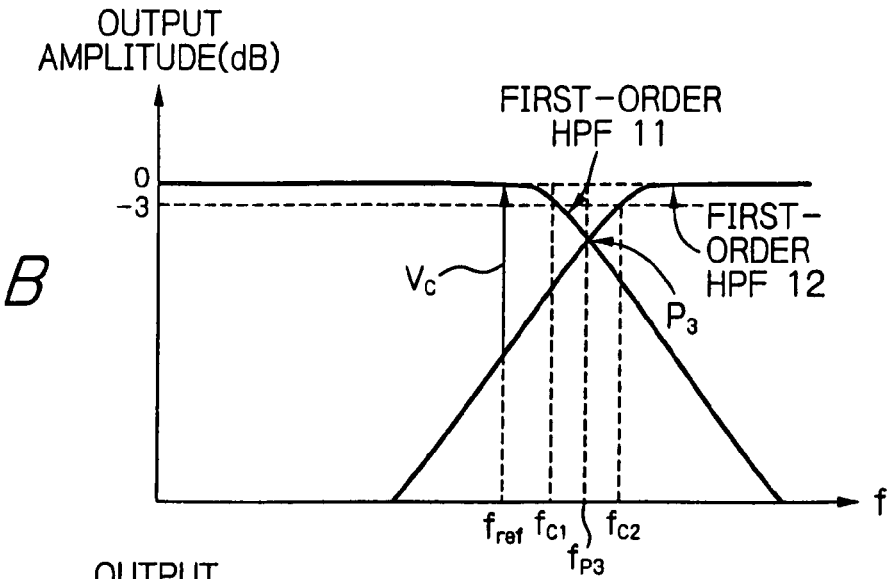
Figure 11C:
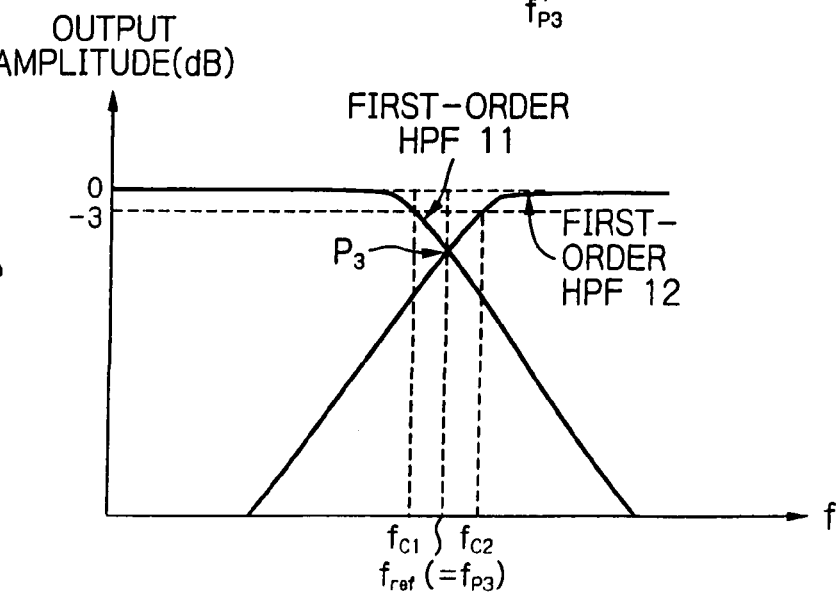

The drive currents of the OTAs of the first-order LPF 11 and the first-order HPF 12 are controlled by the control voltage $V_C$, so that the frequency $f_{P3}$ at the point $P_3$ is finally brought close to the reference frequency $f_{ref}$ as shown in FIG. 11C. In other words, the output amplitude of the first-order LPF 11 finally crosses the output amplitude of the first-order HPF 12 at the reference frequency $f_{ref}$.

In more detail, as shown in FIG. 11A, if the output amplitude of the first-order HPF 12 is higher than that of the first-order LPF 11 at the reference frequency $f_{ref}$, the control voltage $V_C$ is decreased, so that the drive currents of the OTAs of the LPF 11 and the HPF 12 are decreased to increase the frequency $f_{P3}$ at the point $P_3$ toward the reference frequency, $f_{ref}$, thus increasing the cut-off frequencies $f_{C1}$ and $f_{C2}$ of the LPF 11 and the HPF 12. On the other hand, as shown in FIG. 11B, if the output amplitude of the first-order LPF 11 is higher than that of the first-order HPF 12 at the reference frequency $f_{ref}$, the control voltage $V_C$ is increased, so that the drive currents of the OTAs of the LPF 11 and the HPF 12 are increased to decrease the frequency $f_{P3}$ at the point $P_3$ toward the reference frequency $f_{ref}$, thus decreasing the cut-off frequencies $f_{C1}$ and $f_{C2}$ of the LPF 11 and the HPF 12.

In the above-mentioned third example, if the slave gm-C filter 2 is formed by a first-order LPF, the cut-off frequency of the slave gm-C filter 2 will be unambiguously set at $f_{C1}$ as shown in FIG. 11C, and if the slave gm-C filter 2 is formed by a first-order HPF, the cut-off frequency of the slave gm-C filter 2 will be unambiguously set at $f_{C2}$ as shown in FIG. 11C. However, the slave gm-C filter 2 can be formed by another type filter such as a higher-order filter. Even in this case, since the change of the frequency characteristics of the other type filter by the control voltage $V_C$ would follow the change of the frequency characteristics of the filters 11 and 12 by the control voltage $V_C$, the cut-off frequency or center frequency of the slave gm-C filter 2 can be unambiguously set.

Also, in the above-mentioned third example, the first-order LPF and the first-order HPF are interchangeable in accordance with the signs of input terminals of the differential amplifier 15.

Further, in the above-mentioned third example, the reference frequency signal $S_{ref}$ can be rectangular, since the amplitude detectors 13 and 14 can attenuate harmonic waves higher than third-order harmonic waves.

The operation of a fourth example of the filter apparatus of FIG. 3 will be explained next with reference to FIGS. 12A, 12B and 12C where the first-order LPF of FIG. 4 is used as the gm-C filter 11 of FIG. 3 and the second-order BPF of FIG. 8 is used as the gm-C filter 12 of FIG. 3.

The frequency characteristics of the first-order LPF 11 can be determined by the transconductance values and the capacitance value of the circuit of FIG. 4 to have an output amplitude of 20 dB/decade. On the other hand, the frequency characteristics of the second-order BPF 12 can be determined by the transconductance values and the capacitance values of the circuit of FIG. 8 to have an output amplitude. Therefore, since there is a difference in output amplitude between the first-order LPF 11 and the second-order BPF 12, the output amplitude of the first-order LPF 11 crosses that of the second-order BPF 12 at a point $P_3$ where a frequency f is $f_{P4}$ as shown in FIGS. 12A, 12B and 12C. In this case, if $f>f_{P4}$, the output amplitude of the second-order HPF 12 is higher than that of the first-order LPF 11, so that the control voltage $V_C$ is decreased. On the other hand, if $f<f_{P4}$, the output amplitude of the first-order LPF 11 is higher than that of the second-order BPF 12, so that the control voltage $V_C$ is increased.

Figure 12A:
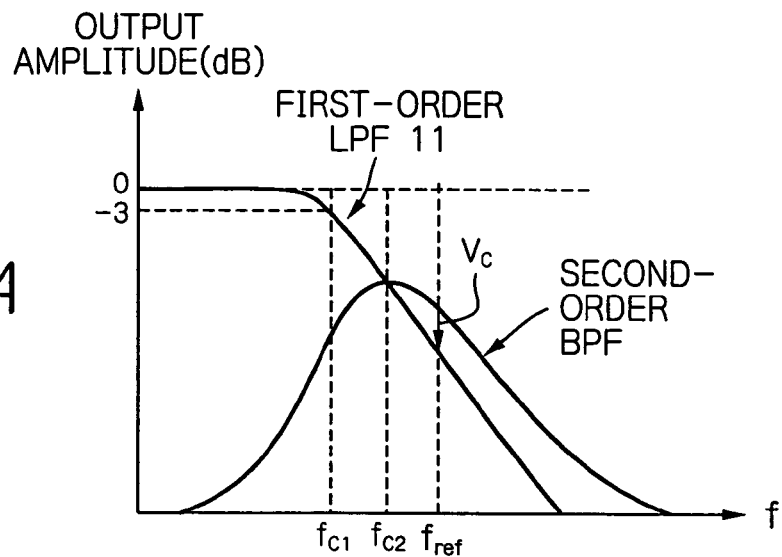
FIGS. 12A, 12B and 12C are graphs for explaining the operation of a fourth example of the filter apparatus of FIG. 3 where the first-order LPF of FIG. 4 and the second-order BPF of FIG. 8 are used as the gm-C filters of FIG. 3.
Figure 12B:
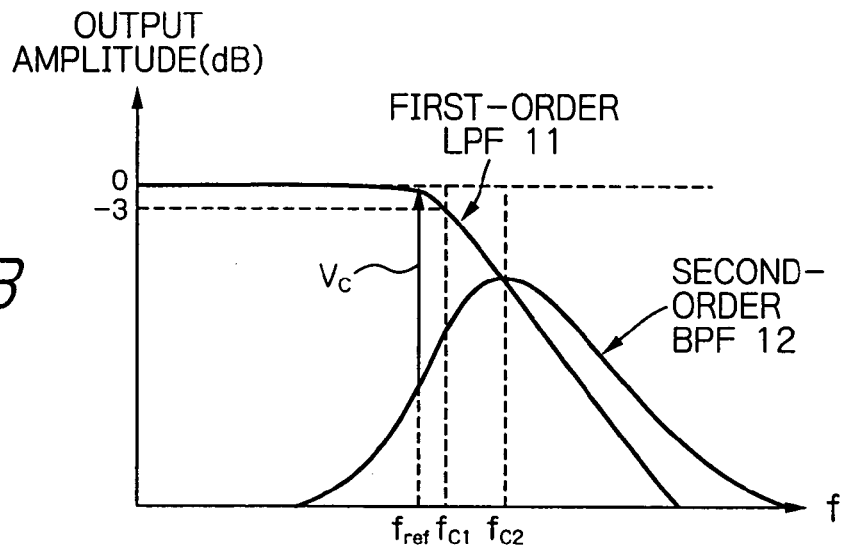
Figure 12C:
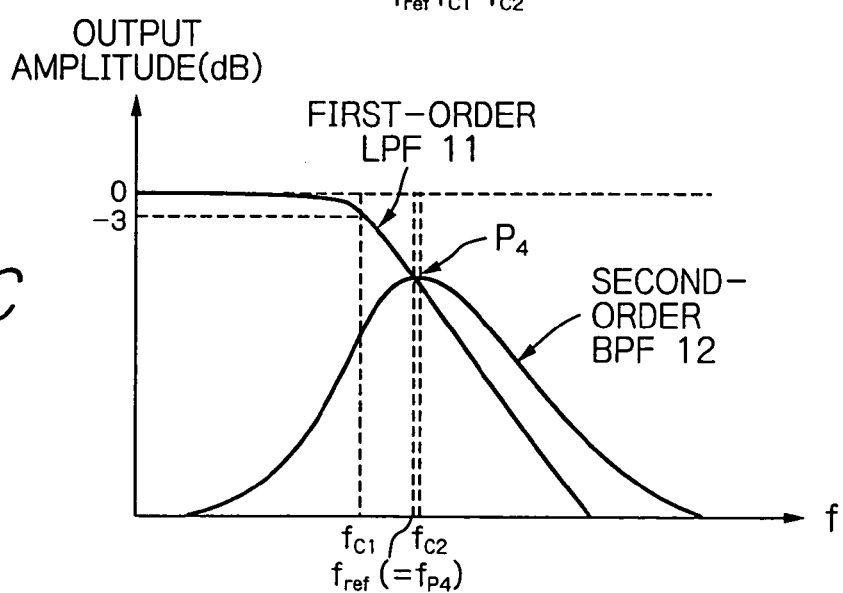

The drive currents of the OTAs of the first-order LPF 11 and the second-order BPF 12 are controlled by the control voltage $V_C$, so that the frequency $f_{P4}$ at the point $P_4$ is finally brought close to the reference frequency $f_{ref}$ as shown in FIG. 12C. In other words, the output amplitude of the first-order LPF 11 finally crosses the output amplitude of the second-order BPF 12 at the reference frequency $f_{ref}$.

In more detail, as shown in FIG. 12A, if the output amplitude of the second-order BPF 12 is higher than that of the first-order LPF 11 at the reference frequency $f_{ref}$, the control voltage $V_C$ is decreased, so that the drive currents of the OTAs of the LPF 11 and the BPF 12 are decreased to increase the frequency $f_{P4}$ at the point $P_4$ toward the reference frequency $f_{ref}$, thus increasing the cut-off frequencies $f_{C1}$ and $f_{C2}$ of the LPF 11 and the BPF 12. On the other hand, as shown in FIG. 12B, if the output amplitude of the first-order LPF 11 is higher than that of the second-order BPF 12 at the reference frequency $f_{ref}$, the control voltage $V_C$ is increased, so that the drive currents of the OTAs of the LPF 11 and the BPF 12 are increased to decrease the frequency $f_{P4}$ at the point $P_4$ toward the reference frequency $f_{ref}$, thus decreasing the cut-off frequency $f_{C1}$ of the LPF 11 and the center frequency $f_{C2}$ of the BPF 12.

In the above-mentioned fourth example, if the slave gm-C filter 2 is formed by a first-order LPF, the cut-off frequency of the slave gm-C filter 2 will be unambiguously set at $f_{C1}$ as shown in FIG. 12 C, and if the slave gm-C filter 2 is formed by a second-order BPF, the center frequency of the slave gm-C filter 2 will be unambiguously set at $f_{C2}$ as shown in FIG. 12C. However, the slave gm-C filter 2 can be formed by another type filter such as a first-order HPF, a second-order LPF, a second-order HPF or a higher-order filter. Even in this case, since the change of the frequency characteristics of the other type filter by the control voltage $V_C$ would follow the change of the frequency characteristics of the filters 11 and 12 by the control voltage $V_C$, the cut-off frequency or center frequency of the slave gm-C filter 2 can be unambiguously set.

Also, in the above-mentioned fourth example, the first-order LPF and the second-order BPF are interchangeable in accordance with the signs of input terminals of the differential amplifier 15.

Further, in the above-mentioned fourth example, the reference frequency signal $S_{ref}$ can be rectangular, since the amplitude detectors 13 and 14 can attenuate harmonic waves higher than third-order harmonic waves.

The operation of a fifth example of the filter apparatus of FIG. 3 will be explained next with reference to FIGS. 13A, 13B and 13C where the second-order BPF of FIG. 8 is used as the gm-C filter 11 of FIG. 3 and the first-order HPF of FIG. 5 is used as the gm-C filter 12 of FIG. 3.

The frequency characteristics of the second-order BPF 11 can be determined by the transconductance values and the capacitance value of the circuit of FIG. 8 to have an output amplitude. On the other hand, the frequency characteristics of the first-order HPF 12 can be determined by the transconductance values and the capacitance values of the circuit of FIG. 5 to have an output amplitude of 20 dB/decade. Therefore, since there is a difference in output amplitude between the second-order BPF 11 and the first-order HPF 12, the output amplitude of the second-order BPF 11 crosses that of the first-order HPF 12 at a point $P_5$ where a frequency f is $f_{P5}$ as shown in FIGS. 13A, 13B and 13C. In this case, if f>$f_{P5}$, the output amplitude of the first-order HPF 12 is higher than that of the second-order BPF 11, so that the control voltage $V_C$ is decreased. On the other hand, if f<$f_{P5}$, the output amplitude of the second-order BPF 11 is higher than that of the first-order HPF 12, so that the control voltage $V_C$ is increased.

Figure 13A:
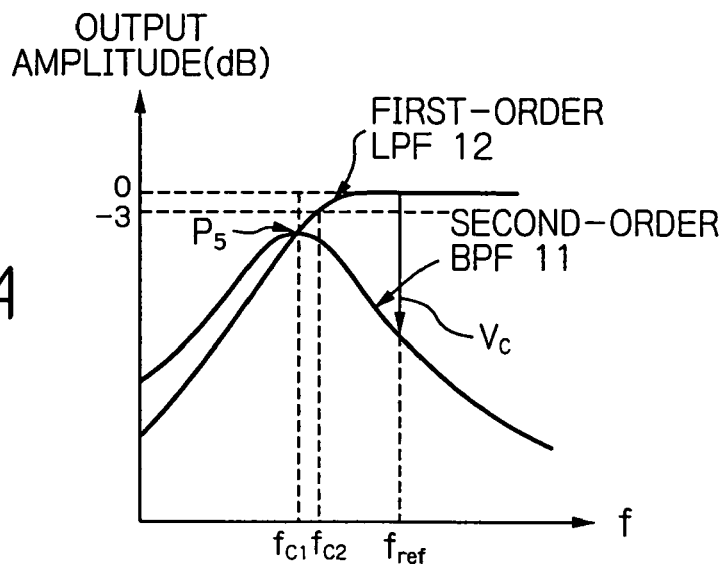
FIGS. 13A, 13B and 13C are graphs for explaining the operation of a fifth example of the filter apparatus of FIG. 3 where the first-order HPF of FIG. 6 and the second-order BPF of FIG. 8 are used as the gm-C filters of FIG. 3.
Figure 13B:
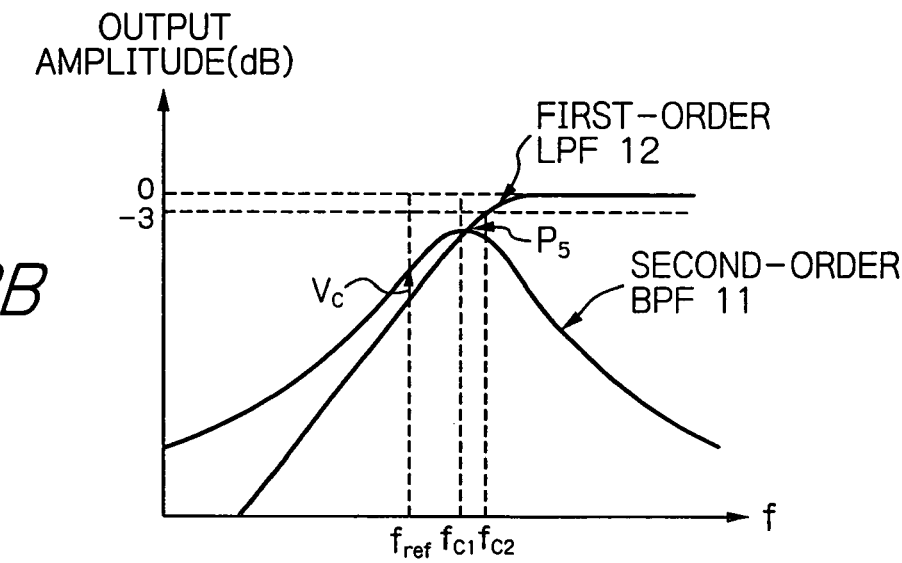
Figure 13C:
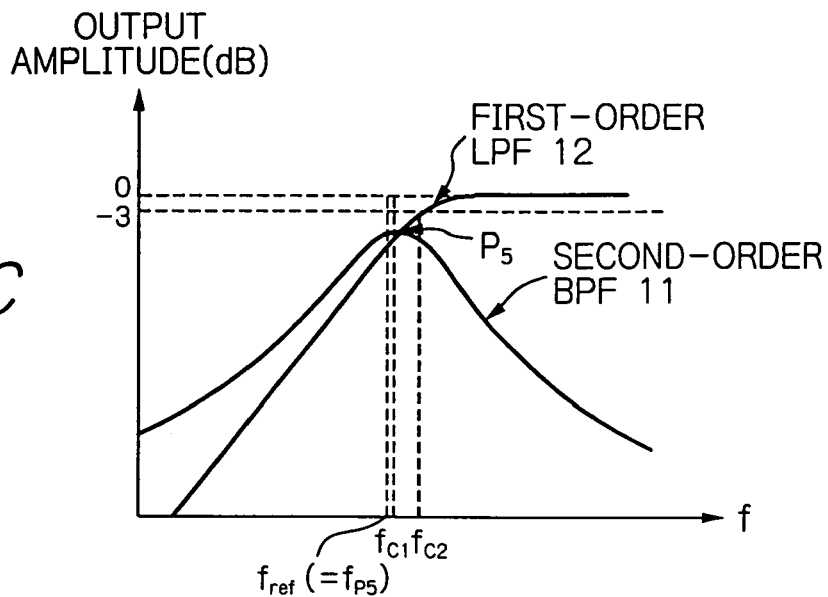

The drive currents of the OTAs of the second-order BPF 11 and the first-order HPF 12 are controlled by the control voltage $V_C$, so that the frequency $f_{P5}$ at the point $P_5$ is finally brought close to the reference frequency $f_{ref}$ as shown in FIG. 13C. In other words, the output amplitude of the second-order BPF 11 finally crosses the output amplitude of the first-order HPF 12 at the reference frequency $f_{ref}$.

In more detail, as shown in FIG. 13A, if the output amplitude of the first-order HPF 12 is higher than that of the second-order BPF 11 at the reference frequency $f_{ref}$, the control voltage $V_C$ is decreased, so that the drive currents of the OTAs of the BPF 11 and the HPF 12 are decreased to increase the frequency $f_{P5}$ at the point $P_5$ toward the reference frequency $f_{ref}$, thus increasing the center frequency $f_{C1}$ of the BPF 11 and the cut-off frequency $f_{C2}$ of the HPF 12. On the other hand, as shown in FIG. 13B, if the output amplitude of the second-order BPF 11 is higher than that of the first-order HPF 12 at the reference frequency $f_{ref}$, the control voltage $V_C$ is increased, so that the drive currents of the OTAs of the BPF 11 and the HPF 12 are increased to decrease the frequency $f_{P5}$ at the point $P_5$ toward the reference frequency $f_{ref}$, thus decreasing the center frequency $f_{C1}$ of the BPF 11 and the cut-off frequency $f_{C2}$ of the HPF 12.

In the above-mentioned fifth example, if the slave gm-C filter 2 is formed by a second-order BPF, the center frequency of the slave gm-C filter 2 will be unambiguously set at $f_{C2}$ as shown in FIG. 13C, and if the slave gm-C filter 2 is formed by a first-order HPF, the cut-off frequency of the slave gm-C filter 2 will be unambiguously set at $f_{C2}$ as shown in FIG. 13C. However, the slave gm-C filter 2 can be formed by another type filter such as a first-order LPF, a second-order LPF or a higher-order filter. Even in this case, since the change of the frequency characteristics of the other type filter by the control voltage $V_c$ would follow the change of the frequency characteristics of the filters 11 and 12 by the control voltage $V_c$, the cut-off frequency or center frequency of the slave gm-C filter 2 can be unambiguously set.

Also, in the above-mentioned fifth example, the second-order BPF and the first-order HPF are interchangeable in accordance with the signs of input terminals of the differential amplifier 15.

Further, in the above-mentioned fifth example, the reference frequency signal $S_{ref}$ can be rectangular, since the amplitude detectors 13 and 14 can attenuate harmonic waves higher than third-order harmonic waves.

The operation of a sixth example of the filter apparatus of FIG. 3 will be explained next with reference to FIGS. 14A, 14B and 14C where the second-order BPF of FIG. 8 is used as each of the gm-C filters 11 and 12 of FIG. 3.

The frequency characteristics of the second-order BPFs 11 and 12 can be determined by the transconductance values and the capacitance value of each circuit of FIG. 8 to have different output amplitudes from each other. Therefore, since there is a difference in output amplitude between the second-order BPFs 11 and 12, the output amplitude of the second-order BPF 11 crosses that of the second-order BPF 12 at a point $P_6$ where a frequency f is $f_{P6}$ as shown in FIGS. 14A, 14B and 14C. In this case, if f>$f_{P6}$, the output amplitude of the second-order BPF 12 is higher than that of the second-order BPF 11, so that the control voltage $V_C$ is decreased. On the other hand, if f<$f_{P6}$, the output amplitude of the second-order BPF 11 is higher than that of the second-order BPF 12, so that the control voltage $V_C$ is increased.

The drive currents of the OTAs of the second-order BPFs 11 and 12 are controlled by the control voltage $V_C$, so that the frequency $f_{P6}$ at the point $P_6$ is finally brought close to the reference frequency $f_{ref}$ as shown in FIG. 14C. In other words, the output amplitude of the second-order BPF 11 finally crosses the output amplitude of the second-order BPF 12 at the reference frequency $f_{ref}$.

In more detail, as shown in FIG. 14A, if the output amplitude of the second-order BPF 12 is higher than that of the second-order BPF 11 at the reference frequency $f_{ref}$, the control voltage $V_C$ is decreased, so that the drive currents of the OTAs of the BPFs 11 and 12 are decreased to increase the frequency $f_{P6}$ at the point $P_6$ toward the reference frequency $f_{ref}$, thus increasing the center frequency $f_{C1}$ of the BPF 11 and the center frequency $f_{C2}$ of the BPF 12. On the other hand, as shown in FIG. 14B, if the output amplitude of the second-order BPF 11 is higher than that of the second-order BPF 12 at the reference frequency $f_{ref}$, the control voltage $V_C$ is increased, so that the drive currents of the OTAs of the BPFs 11 and 12 are increased to decrease the frequency $f_{P6}$ at the point $P_6$ toward the reference frequency $f_{ref}$, thus decreasing the center frequency $f_{C1}$ of the BPF 11 and the center frequency $f_{C2}$ of the BPF 12.

In the above-mentioned sixth example, if the slave gm-C filter 2 is formed by a second-order BPF, the center frequency of the slave gm-C filter 2 will be unambiguously set at $f_{C1}$ or $f_{C2}$ as shown in FIG. 14C. However, the slave gm-C filter 2 can be formed by another type filter such as a first-order LPF, a first-order HPF or a higher-order filter. Even in this case, since the change of the frequency characteristics of the other type filter by the control voltage $V_C$ would follow the change of the frequency characteristics of the filters 11 and 12 by the control voltage $V_c$, the cut-off frequency or center frequency of the slave gm-C filter 2 can be unambiguously set.

Also, in the above-mentioned sixth example, the reference frequency signal $S_{ref}$ can be rectangular, since the amplitude detectors 13 and 14 can attenuate harmonic waves higher than third-order harmonic waves.

The amplitude amplifiers 13 and 14 of FIG. 3 have the same structure, so that the output amplitude of the gm-C filter 11 surely crosses that of the gm-C filter 12 at one point at the reference frequency $f_{ref}$.

A first example of the amplitude amplifier 13 (14) of FIG. 3 is illustrated in FIG. 15. In FIG. 15, assume that the gm-C filter 11(12) is single-ended, so that an amplifier 150 is provided to generate the output amplitude signal $V_i$ and its inverted signal /$V_i$. However, if the gm-C filter 11(12) is double-ended, the amplifier 150 can be replaced by an amplifier associated with two output resistors having the same resistance value to generate a common mode voltage (intermediate voltage) between the voltage $V_i$ and /$V_i$ (see: FIG. 16).

In FIG. 15, reference numeral 151 designates a differential pair formed by N-channel MOS transistors 1511 and 1512 with a common source connected to a current source 152, and 153 designates a differential pair formed by N-channel MOS transistors 1531 and 1532 with source connected to a current source 154. In this case, $$(W2/L2)/(W1/L1) = (W2'/L2')/(W1'/L1') > 1 \quad (6)$$

where W1 and L1 are the gate width and gate length, respectively, of the N-channel MOS transistor 1511;
W2 and L2 are the gate width and gate length, respectively, of the N-channel MOS transistor 1512;
W1' and L1' are the gate width and gate length, respectively, of the N-channel MOS transistor 1531; and
W2' and L2' are the gate width and gate length, respectively, of the N-channel MOS transistor 1532.

The gates of the N-channel MOS transistors 1511 and 1532 receive the output amplitude signal $V_i$ of the gm-C filter 11 (12), while the gates of the N-channel MOS transistors 1512 and 1531 receive the inverted signal of the output amplitude signal $/V_i$ of the gm-C filter 11 (12).

A current mirror circuit 155 is formed by P-channel MOS transistors 1551 and 1552 with a common source powered by a power supply voltage $V_{DD}$. The drain and gate of the P-channel MOS transistor 1551 are connected to the drains of the N-channel MOS transistors 1511 and 1531, and the drain of the P-channel MOS transistor 1552 is connected to the drains of the N-channel MOS transistors 1512 and 1532.

A current mirror circuit 156 is formed by P-channel MOS transistors 1561 and 1562 with a common source powered by a power supply voltage $V_{DD}$. The drain and gate of the P-channel MOS transistor 1561 are connected to the drains of the N-channel MOS transistors 1512 and 1532.

Thus, the drain of the P-channel MOS transistor 1562 generates a current $I_o$ having a square characteristic of the output amplitude of the gm-C filter 11 (12) which is converted by a current-to-voltage converter 157 into a voltage and then is transmitted to the differential amplifier 15 of FIG. 3.

The details of the amplitude amplifier of FIG. 15 are disclosed in FIG. 1(c) of JP-4-165805-A.

A second example of the amplitude amplifier 13 (14) of FIG. 3 is illustrated in FIG. 16. In FIG. 16, assume that the gm-C filter 11(12) is double-ended, so that an amplifier 160 associated with two output resistors r1 and r2 having the same resistance value to generate an common mode voltage (intermediate voltage) between an voltage $V_i$ and its inverted voltage $/V_i$. However, if the gm-C filter 11(12) is single-ended, the amplifier 160 associated with the resistors r1 and r2 can be replaced by an amplifier to generate the voltage $V_i$ and its inverted voltage $/V_i$ (see FIG. 15).

In FIG. 16, N-channel MOS transistors 161, 162, 163 and 164 have a common source connected to a current source 165 whose current is $I_R$. Note that all the N-channel MOS transistors 161, 162, 163 and 164 have the same gate width and gate length.

An input current $I^+$ is supplied from a power supply terminal ($V_{DD}$) via a resistor 166 to the drains of the N-channel MOS transistors 161 and 162, and an input current $I^-$ is supplied from, the power supply terminal ($V_{DD}$) via a resistor 167 to the drains of the N-channel MOS transistors 163 and 164. Note that the resistors 166 and 167 have the same value. In this case, $$I^+ + I^- = I_R \quad (7)$$

Differential input voltages, whose difference is the voltage $V_i$, are applied to the gates of the N-channel MOS transistors 161 and 162, and a common mode voltage (intermediate voltage) between the differential input voltages is applied to the gates of the N-channel MOS transistors 163 and 164. As a result, a differential output current $\Delta I(=I^+-I^-)$ exhibits a squaring characteristic over a wide input voltage. The differential output current $\Delta I$ is supplied as an output voltage $V_o$ to the differential amplifier 15 of FIG. 3.

The details of the amplitude amplifier of FIG. 16 are disclosed in Katsuji Kimura, "An MOS OTA and an MOS Four-Quadrant Analog Multiplier Using the Quadritail Cell", IEICE Trans. Fundamentals, Vol. E75-A, No. 12 pp. 1774-1776, December 1992.

In the above-described embodiment, all the OTAs of the gm-C filters 11 and 12 are controlled by the control voltage of the differential amplifier 15. However, at least one of the OTAs of each of the gm-C filters 11 and 12 can be controlled by the control voltage of the differential amplifier 15.

As explained hereinabove, according to the present invention, since the gm-C filters of the master circuit can be formed by a lower-order filter, the filter apparatus can be simplified. Also, since the capacitance values of the gm-C filters of the master circuit can be comparable to those of the slave gm-C filter, parasitic capacitances of realized circuits can be ignored.

The invention claimed is:

1. A filter apparatus comprising:
   a master circuit for receiving a reference frequency signal having a reference frequency and generating a control voltage; and
   a slave circuit comprising a single slave gm-C filter and formed by at least one operational transconductance amplifier and at least one capacitor, the operational transconductance amplifier of said single slave gm-C filter being controlled by said control voltage to tune a cut-off frequency or center frequency of said single slave gm-C filter, said master circuit comprising:
      first and second gm-C filters each formed by at least one operational transconductance amplifier and at least one capacitor and having different frequency characteristics from each other, said first and second gm-C filters having respective cut-off frequencies and being adapted to receive said reference frequency signal;
      first and second amplitude detectors having inputs connected to outputs of said first and second gm-C filters, respectively; and
      a differential amplifier having inputs connected to outputs of said first and second amplitude detectors to amplify a difference-voltage therebetween to generate said control voltage, so that said difference-voltage is brought close to zero,
   wherein at least one of said reference frequency and said respective cut-off frequencies of said first and second gm-C filters is different from the other two of said reference frequency and said respective cut-off frequencies of said first and second gm-C filters, and
   wherein a type of said single slave gm-C filter comprises one of a low pass filter, a high pass filter, and a band pass filter and is different from a type of said first and second gm-C filters.

2. The filter apparatus as set forth in claim 1, wherein said first gm-C filter comprises a second-order low pass filter, and said second gm-C filter comprises a first-order low pass filter.

3. The filter apparatus as set forth in claim 1, wherein said first gm-C filter comprises a first-order high pass filter, and said second gm-C filter comprises a second-order high pass filter.

4. The filter apparatus as set forth in claim 1, wherein said first gm-C filter comprises a first-order low pass filter, and said second gm-C filter comprises a first-order high pass filter.

5. The filter apparatus as set forth in claim 1, wherein said first gm-C filter comprises a first-order low pass filter, and said second gm-C filter comprises a second-order band pass filter.

6. The filter apparatus as set forth in claim 1, wherein said first gm-C filter comprises a second-order band pass filter, and said second gm-C filter comprises a first-order high pass filter.

7. The filter apparatus as set forth in claim 1, wherein said first gm-C filter comprises a second-order band pass filter, and said second gm-C filter comprises another second-order band pass filter, said second-order band pass filters having different frequency characteristics from each other.

8. The filter apparatus as set forth in claim 1, wherein said first and second amplitude detectors have the same structure.

9. A filter apparatus comprising:
a master circuit for receiving a reference frequency signal having a reference frequency to generate a control voltage; and
a slave gm-C filter formed by at least one operational transconductance amplifier and at least one capacitor, said master circuit comprising:
first and second gm-C filters each formed by at least one operational transconductance amplifier and at least one capacitor and having different frequency characteristics from each other, said first and second gm-C filters having respective cut-off frequencies and being adapted to receive said reference frequency signal;
first and second amplitude detectors having inputs connected to outputs of said first and second gm-C filters, respectively; and
a differential amplifier having inputs connected to outputs of said first and second amplitude detectors to amplify a difference-voltage therebetween so as to directly generate said control voltage, and having an output directly connected to said first and second gm-C filters to directly apply said control voltage thereto so that said difference-voltage is brought close to zero, said differential amplifier output also being directly connected to the slave gm-C filter to apply said control voltage thereto so that the operational transconductance amplifier of said slave gm-C filter is controlled by said control voltage to tune a cut-off frequency or center frequency of said slave gm-C filter,
wherein at least one of said reference frequency and said respective cut-off frequencies of said first and second gm-C filters is different from the other two of said reference frequency and said respective cut-off frequencies of said first and second gm-C filters, and
wherein a type of said slave gm-C filter comprises one of a low pass filter, a high pass filter, and a band pass filter and is different from a type of said first and second gm-C filters.

10. The filter apparatus as set forth in claim 1, wherein frequency characteristics of said single slave gm-C filter are substantially different from those of said first and second gm-C filters.

11. The filter apparatus as set forth in claim 9, wherein frequency characteristics of said single slave gm-C filter are substantially different from those of said first and second gm-C filters.

12. A filter apparatus comprising:
a master circuit for receiving a reference frequency signal having a reference frequency and generating a control voltage, said master circuit comprising:
a first gm-C filter;
a second gm-C filter, said first and second gm-C filters comprising:
at least one operational transconductance amplifier controlled by said control voltage, and
at least one capacitor, said first and second gm-C filters receiving said reference frequency signal and having different respective cut-off frequencies and different frequency characteristics from each other;
first and second amplitude detectors having inputs connected to outputs of said first and second gm-C filters, respectively; and
a differential amplifier having inputs connected to outputs of, and to amplify a difference-voltage between, said first and second amplitude detectors, to generate said control voltage and feed said control voltage back to said first and second gm-C filters such that said difference-voltage is brought close to zero; and
a slave circuit comprising a single slave gm-C filter and formed by at least one operational transconductance amplifier and at least one capacitor, the operational transconductance amplifier of said single slave gm-C filter being controlled by said control voltage to tune a cut-off frequency or center frequency of said single slave gm-C filter,
wherein a type of said single slave gm-C filter comprises one of a low pass filter, a high pass filter, and a band pass filter and is different from a type of said first and second gm-C filters.

13. The filter apparatus as set forth in claim 12, wherein said first gm-C filter comprises a second-order low pass filter, and said second gm-C filter comprises a first-order low pass filter.

14. The filter apparatus as set forth in claim 12, wherein said first gm-C filter comprises a first-order high pass filter, and said second gm-C filter comprises a second-order high pass filter.

15. The filter apparatus as set forth in claim 12, wherein said first gm-C filter comprises a first-order low pass filter, and said second gm-C filter comprises a first-order high pass filter.

16. The filter apparatus as set forth in claim 12, wherein said first gm-C filter comprises a first-order low pass filter, and said second gm-C filter comprises a second-order band pass filter.

17. The filter apparatus as set forth in claim 12, wherein said first gm-C filter comprises a second-order band pass filter, and said second gm-C filter comprises a first-order high pass filter.

18. The filter apparatus as set forth in claim 12, wherein said first gm-C filter comprises a second-order band pass filter, and said second gm-C filter comprises another second-order band pass filter.

19. The filter apparatus as set forth in claim 12, wherein said first and second amplitude detectors have the same structure.

20. The filter apparatus as set forth in claim 12, wherein respective orders of said first and second gm-C filters are lower than an order of said single slave gm-C filter.

* * * * *